United States Patent
Urairi et al.

(10) Patent No.: US 8,778,118 B2
(45) Date of Patent: Jul. 15, 2014

(54) MANUFACTURING METHOD OF LASER PROCESSED PARTS, AND PRESSURE-SENSITIVE ADHESIVE SHEET FOR LASER PROCESSING USED FOR THE SAME

(75) Inventors: Masakatsu Urairi, Ibaraki (JP); Atsushi Hino, Ibaraki (JP); Naoyuki Matsuo, Ibaraki (JP); Tomokazu Takahashi, Ibaraki (JP); Takeshi Matsumura, Ibaraki (JP); Syouji Yamamoto, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 241 days.

(21) Appl. No.: 12/820,375

(22) Filed: Jun. 22, 2010

(65) Prior Publication Data

US 2010/0273313 A1    Oct. 28, 2010

Related U.S. Application Data

(62) Division of application No. 10/554,540, filed as application No. PCT/JP2004/005554 on Apr. 19, 2004, now abandoned.

(30) Foreign Application Priority Data

| Apr. 25, 2003 | (JP) | 2003-120927 |
| Dec. 25, 2003 | (JP) | 2003-430093 |
| Mar. 29, 2004 | (JP) | 2004-094431 |
| Mar. 29, 2004 | (JP) | 2004-094635 |
| Mar. 29, 2004 | (JP) | 2004-094732 |
| Mar. 29, 2004 | (JP) | 2004-095492 |
| Mar. 29, 2004 | (JP) | 2004-095785 |
| Mar. 29, 2004 | (JP) | 2004-095875 |

(51) Int. Cl.
  *B32B 38/04*   (2006.01)
  *B32B 27/32*   (2006.01)
  *H01L 21/26*   (2006.01)

(52) U.S. Cl.
  USPC ........ 156/247; 156/250; 156/272.8; 438/463; 257/E21.328

(58) Field of Classification Search
  USPC .......................................................... 156/247
  See application file for complete search history.

(56) References Cited

U.S. PATENT DOCUMENTS

5,169,678 A    12/1992 Cole et al.
(Continued)

FOREIGN PATENT DOCUMENTS

EP    0 863 231 A    9/1998
(Continued)

OTHER PUBLICATIONS

Office Action issued by the Korean Patent Office on Jan. 14, 2011 for the counterpart Korean Patent Application No. 10-2005-7020275.
(Continued)

*Primary Examiner* — Philip Tucker
*Assistant Examiner* — Vicki Wu
(74) *Attorney, Agent, or Firm* — Knobbe, Martens, Olson & Bear LLP

(57) ABSTRACT

A manufacturing method of laser processed parts in which at least a pressure-sensitive adhesive layer is provided on a base material as a pressure-sensitive adhesive sheet for laser processing, using a material having specified physical properties. This method comprises adhering the pressure-sensitive adhesive sheet for laser processing to the laser beam exit side of the work by way of the pressure-sensitive adhesive layer, processing the work by irradiating the work with a laser beam of within 2 times of the irradiation intensity for forming a through-hole in the work, at higher than the irradiation intensity of threshold for inducing ablation of the work, and peeling the pressure-sensitive adhesive sheet for laser processing from the work after the machining. Therefore, contamination of the work surface by decomposition products can be effectively suppressed, and laser processed parts can be manufactured easily and at high production efficiency.

8 Claims, 4 Drawing Sheets

(56) References Cited

U.S. PATENT DOCUMENTS

| | | | |
|---|---|---|---|
| 5,271,946 A | 12/1993 | Hettche | |
| 5,278,199 A * | 1/1994 | Ohkawa et al. | 522/95 |
| 5,460,921 A | 10/1995 | Cywar et al. | |
| 5,493,096 A | 2/1996 | Koh | |
| 5,523,266 A | 6/1996 | Nishimura et al. | |
| 5,538,789 A | 7/1996 | Capote et al. | |
| 5,981,145 A | 11/1999 | Ding et al. | |
| 6,255,405 B1 | 7/2001 | Kang et al. | |
| 6,258,426 B1 | 7/2001 | Yamamoto et al. | |
| 6,407,363 B2 | 6/2002 | Dunsky et al. | |
| 6,413,839 B1 * | 7/2002 | Brown et al. | 438/463 |
| 6,444,310 B1 | 9/2002 | Senoo et al. | |
| 6,561,743 B1 | 5/2003 | Nakatsu | |
| 6,596,968 B2 | 7/2003 | Yamamoto et al. | |
| 6,610,960 B2 | 8/2003 | De Steur et al. | |
| 6,811,888 B2 | 11/2004 | Hamann et al. | |
| 6,864,459 B2 | 3/2005 | Chang et al. | |
| 7,586,060 B2 | 9/2009 | Urairi et al. | |
| 8,168,030 B2 | 5/2012 | Matsuo et al. | |
| 2001/0015259 A1 | 8/2001 | Toyoda et al. | |
| 2002/0090493 A1 | 7/2002 | Kamada et al. | |
| 2002/0104831 A1 | 8/2002 | Chang et al. | |
| 2002/0127824 A1 | 9/2002 | Shelton et al. | |
| 2003/0108762 A1 | 6/2003 | Hamann et al. | |
| 2003/0207062 A1 | 11/2003 | Herzog et al. | |
| 2003/0226832 A1 | 12/2003 | Liu et al. | |
| 2004/0002199 A1 | 1/2004 | Fukuyo et al. | |
| 2004/0048054 A1 | 3/2004 | Tobita et al. | |
| 2004/0112880 A1 | 6/2004 | Sekiya | |
| 2004/0132294 A1 | 7/2004 | Takagi et al. | |
| 2005/0003635 A1 | 1/2005 | Takekoshi | |
| 2005/0029238 A1 | 2/2005 | Chen | |
| 2005/0173387 A1 | 8/2005 | Fukuyo et al. | |
| 2005/0181581 A1 | 8/2005 | Fukuyo et al. | |
| 2005/0184037 A1 | 8/2005 | Fukuyo et al. | |
| 2005/0189330 A1 | 9/2005 | Fukuyo et al. | |
| 2005/0194364 A1 | 9/2005 | Fukuyo et al. | |
| 2005/0242073 A1 | 11/2005 | Nakamura et al. | |
| 2006/0040473 A1 | 2/2006 | Fukuyo et al. | |
| 2006/0157191 A1 | 7/2006 | Matsuo et al. | |
| 2006/0160331 A1 | 7/2006 | Fukuyo et al. | |
| 2006/0222813 A1 | 10/2006 | Kato et al. | |
| 2006/0228650 A1 | 10/2006 | Matsuo et al. | |
| 2006/0246279 A1 | 11/2006 | Urairi et al. | |
| 2007/0181543 A1 | 8/2007 | Urairi et al. | |

FOREIGN PATENT DOCUMENTS

| | | |
|---|---|---|
| EP | 0 976 802 | 2/2000 |
| EP | 1 634 673 | 3/2006 |
| JP | 5-330046 | 12/1993 |
| JP | 6-163687 | 6/1994 |
| JP | 6-170822 | 6/1994 |
| JP | 7-168386 | 7/1995 |
| JP | 9-136421 | 5/1997 |
| JP | 9-188854 | 7/1997 |
| JP | 63-036988 | 2/1998 |
| JP | 2000-104026 | 4/2000 |
| JP | 2001-118862 | 4/2001 |
| JP | 2001-323075 | 11/2001 |
| JP | 2002-105221 | 4/2002 |
| JP | 2002-134921 | 5/2002 |
| JP | 2002-178181 | 6/2002 |
| JP | 2002-239766 | 8/2002 |
| JP | 2002-322438 | 11/2002 |
| JP | 2002-338911 | 11/2002 |
| JP | 2002-343747 | 11/2002 |
| JP | 2002343747 A * | 11/2002 |
| JP | 2003-23230 | 1/2003 |
| JP | 2003-33889 | 2/2003 |
| JP | 2003-034780 | 2/2003 |
| JP | 2003-113355 | 4/2003 |
| JP | 2003-173988 | 6/2003 |
| JP | 2003-179360 | 6/2003 |
| JP | 2003-211277 | 7/2003 |
| JP | 2004-91547 | 3/2004 |
| JP | 2004-122182 | 4/2004 |
| JP | 2004-188475 | 7/2004 |
| JP | 2004-230391 | 8/2004 |
| JP | 2004-311848 | 11/2004 |
| JP | 2004-322157 | 11/2004 |
| JP | 2005-186109 | 7/2005 |
| JP | 2005-186110 | 7/2005 |
| JP | 2005-187619 | 7/2005 |
| JP | 2005-279676 | 10/2005 |
| JP | 2005-279680 | 10/2005 |
| JP | 2005-279682 | 10/2005 |
| JP | 2005-279692 | 10/2005 |
| JP | 2005-279696 | 10/2005 |
| JP | 2005-279698 | 10/2005 |
| JP | 2005-279749 | 10/2005 |
| JP | 2005-279752 | 10/2005 |
| JP | 2005-279754 | 10/2005 |
| JP | 2005-279755 | 10/2005 |
| JP | 2005-279757 | 10/2005 |
| JP | 2005-279758 | 10/2005 |
| JP | 2006-192474 | 7/2006 |
| JP | 2006-192478 | 7/2006 |
| WO | WO 01/41968 | 6/2001 |
| WO | WO 03/028949 | 4/2003 |
| WO | WO 2004/096483 | 11/2004 |
| WO | WO 2005/063435 | 7/2005 |

OTHER PUBLICATIONS

European Office Action issued on the corresponding European Patent Application No. 04728276.9, dated Jul. 8, 2009.

Malaysian Office Action issued on the corresponding Malaysian patent Application No. PI20041507, dated Nov. 28, 2007.

International Search Report issued on the corresponding PCT Application No. PCT/JP2004/005554, dated Aug. 10, 2004.

International Search Report issued on the related PCT Application No. PCT/JP2004/016268, dated Feb. 15, 2005.

Japanese Office Action issued on the corresponding Japanese Patent Application No. 2003-120927, dated May 27, 2009.

Supplementary European Search Report issued on the corresponding European Patent Application No. 04728276, dated Mar. 11, 2009.

File History of the related U.S. Appl. No. 11/331,465, for the period of Oct. 8, 2009-Jun. 22, 2010.

File History of the related U.S. Appl. No. 11/331,674, for the period of Oct. 8, 2009-Jun. 22, 2010.

File History of the related U.S. Appl. No. 10/584,825, for the period of Oct. 8, 2009-Jun. 22, 2010.

Japanese Office Action issued in the corresponding Japanese Patent Application No. 2004-094431, dated Jun. 22, 2010.

File History of the related U.S. Appl. No. 11/331,674, for the period of Jun. 23, 2010-Jul. 31, 2010.

* cited by examiner

MANUFACTURING METHOD OF LASER PROCESSED PARTS, AND PRESSURE-SENSITIVE ADHESIVE SHEET FOR LASER PROCESSING USED FOR THE SAME

CROSS-REFERENCE TO PRIORITY AND RELATED APPLICATIONS

This application is a divisional application of U.S. patent application Ser. No. 10/554,540, filed Oct. 24, 2005 now abandoned, which the U.S. National Phase under 35 U.S.C. §371 of International Application PCT/JP2004/005554, filed Apr. 19, 2004, which claims priority to Japanese Patent Application No. 2003-120927, filed Apr. 25, 2003, No. 2003-430093, filed Dec. 25, 2003, No. 2004-094431, filed Mar. 29, 2004, No. 2004-094635, filed Mar. 29, 2004, No. 2004-094732, filed Mar. 29, 2004, No. 2004-095875, filed Mar. 29, 2004, No. 2004-095492, filed Mar. 29, 2004, and No. 2004-095785, filed Mar. 29, 2004. This application also is related to U.S. patent application Ser. No. 11/331,465, filed Jan. 13, 2006 now U.S. Pat. No. 8,168,030, Ser. No. 11/331,674, filed Jan. 13, 2006, and Ser. No. 10/584,825, filed Jun. 26, 2006, which is now U.S. Pat. No. 7,586,060, issued Sep. 8, 2009.

TECHNICAL FIELD

The present invention relates to a manufacturing method of laser processed parts for machining works such as various sheet materials, circuit boards, semiconductor wafers, glass substrates, ceramic substrates, metal substrates, semiconductor laser or other light emitting or receiving element substrates, MEMS substrates, semiconductor packages, cloth, leather, paper or the like, by using laser, by cutting, drilling, marking, grooving, scribing, trimming, or other shaping process, and an pressure-sensitive adhesive sheet for laser processing used for this purpose.

BACKGROUND ART

As the electronic and electric appliances are reduced in size recently, component parts are also reduced in size and advanced in definition, and high definition and high precision are demanded in machining of parts at machining precision of +/−50 μm or less. In the conventional press processing or blanking process, the precision is about +/−100 μm at most, and such demand cannot be satisfied. Drilling of materials is also demanded to conform to high definition and high precision, and drilling by using conventional drill or die cannot meet the needs.

To solve the problems, lately, machining of materials by using laser beam is attracting wide attention. In particular, the machining method by ultraviolet absorption ablation of laser beam of small heat damage and high definition is noticed as precise outline processing method or fine drilling method.

By using laser beam, however, carbon deposits and other decomposition matter generated from the work, pressure-sensitive adhesive tape or absorption plate during laser processing may stick to the surface of the work. It hence requires an aftertreatment called desmearing to remove the decomposition products. For example, in the case of wet desmearing by using aqueous solution of potassium permanganate, the environmental pollution is increased due to treatment of the waste liquid.

Sticking strength of decomposition products increases in proportion to the laser beam power. Accordingly, in the case of laser processing at high laser power, it is hard to remove decomposition products in aftertreatment.

On the other hand, if a specified region of the work is cut off at once, the work (cut piece) drops off immediately after processing, and handling is difficult. To avoid this, part of the specified region is left over without being processed.

As a specific example of laser processing, a dicing method of semiconductor wafer is disclosed, for example, Japanese Laid-open Patent No. 2002-343747. In this method, the work is supported and fixed on a dicing sheet, and the work is diced by laser beam. As described in this patent reference 1, the dicing sheet comprises a base material including a support sheet, and a pressure-sensitive adhesive layer disposed on one side of the base material. Further, the pressure-sensitive adhesive layer can be cut off by laser beam, while the support sheet cannot be cut off by laser beam.

When using the dicing sheet disclosed in this publication, the pressure-sensitive adhesive layer is thermally cut off by fundamental wave (wavelength 1064 nm) of YAG laser being used, or laser beam of ruby laser (wavelength 694 nm). Accordingly, a decomposition product of the pressure-sensitive adhesive layer may invade into the interface of the dicing sheet and the work, and may stick firmly to the interface area. As a result, it becomes difficult to peel off the dicing sheet from the work after application of laser processing. It is hence hard to remove the deposit completely by aftertreatment. Further, since the process includes a thermal process, edge portions are exposed to thermal damages. As a result, the processing precision is lowered and the reliability also declines.

A laser processing method combining fundamental wave of YAG laser and water microjet has been also proposed (Japanese Laid-open Patent No. 2003-34780). As disclosed in this publication, the pressure-sensitive adhesive tape for laser dicing has a non-radiation curing type pressure-sensitive adhesive layer and a radiation curing type pressure-sensitive adhesive formed on one side of the base material, and the base material can pass jet water stream of water jet, and the non-radiation curing type pressure-sensitive adhesive layer is provided between the base material and the radiation curing type pressure-sensitive adhesive layer.

When this pressure-sensitive adhesive tape is combined with the water microjet and laser, and used in a dicing method of semiconductor wafer, thermal damage of pressure-sensitive adhesive tape is lessened by the cooling effect of the water jet. Accordingly, it is expected to suppress melting or decomposition of pressure-sensitive adhesive layer or base material by heat of laser irradiation. However, when the pressure-sensitive adhesive tape is used in the dicing method of semiconductor by using only the laser, the pressure-sensitive adhesive layer or base material may be melted by the heat of laser irradiation, and the decomposition products of pressure-sensitive adhesive layer or base material may invade into the interface of the pressure-sensitive adhesive sheet and semiconductor wafer, and may stick firmly to the interface area, and similar problems as mentioned above may occur. When using water microjet, there is a limit in reducing the cutting width in dicing. This is because the cutting width is limited by the diameter of the water jet. Hence, the manufacturing efficiency of semiconductor chips is lowered.

SUMMARY OF THE INVENTION

The invention is devised in the light of the above problems, and it is hence an object thereof to present a manufacturing method of laser processed parts easily and at production efficiency by effectively suppressing contamination of the machining surface due to decomposition products when machining the work by ablation of laser beam. It is other object to present a pressure-sensitive adhesive sheet for laser processing for use in the manufacturing method of laser processed parts.

The present inventors intensively studied the manufacturing method of laser processed parts and pressure-sensitive adhesive sheet for laser processing in order to solve the above problems. As a result, noticing various physical properties mentioned below, it has been found that the objects can be also achieved by constituting as described below, and thereby the invention has been achieved.

That is, the manufacturing method of laser processed parts of the invention is a manufacturing method of laser processed parts characterized by using a pressure-sensitive adhesive sheet for laser processing, irradiating the work with laser beam of wavelength in ultraviolet region or laser beam capable of absorbing the light in ultraviolet region passing through multiple photon absorbing process, and processing the work by ablation, in which at least a pressure-sensitive adhesive layer is provided on a base material as the pressure-sensitive adhesive sheet for laser processing, using a material of which ratio of light absorption coefficient expressed in formula (1) below is less than 1, and this method comprises a step of adhering the pressure-sensitive adhesive sheet for laser processing to the laser beam exit side of the work by way of the pressure-sensitive adhesive layer, a step of processing the work by irradiating the work with a laser beam of within 2 times of the irradiation intensity for forming a through-hole in the work, at higher than the irradiation intensity of threshold for inducing ablation of the work, and a step of peeling the pressure-sensitive adhesive sheet for laser processing from the work after the machining. As the work, various materials may be used, including sheet material, circuit board, semiconductor wafer, glass substrate, ceramic substrate, metal substrate, light emitting or receiving element substrate of semiconductor laser, MEMS substrate, or semiconductor package.

Ratio of light absorption coefficient=(absorption coefficient of pressure-sensitive adhesive sheet for laser processing in light of wavelength of 355 nm)/(absorption coefficient of work in light of wavelength of 355 nm) (1)

In the manufacturing method of laser processed parts of the invention, a pressure-sensitive adhesive sheet for laser process (or merely pressure-sensitive adhesive sheet) having at least a pressure-sensitive adhesive layer provided on the base material is used. This pressure-sensitive adhesive sheet satisfies the condition that the ratio of absorption coefficient expressed in formula (1) is less than 1.

When using the pressure-sensitive adhesive sheet of which ratio of absorption coefficient is less than 1, the invasion length of laser beam (=1/(absorption coefficient)) can be set deeper than in the work. This is because the absorption coefficient of the pressure-sensitive adhesive sheet is smaller than the absorption coefficient of the work. Hence, if exposed to laser beam, the heat accumulated per unit volume of pressure-sensitive adhesive sheet can be set smaller than in the work. As a result, the pressure-sensitive adhesive sheet is harder to process than the work.

Therefore, if the work is irradiated with laser beam of more than the irradiation intensity of the threshold inducing ablation of the work, and within 2 times of the irradiation intensity for forming a through-hole in the work, the work is processed by laser but the pressure-sensitive adhesive sheet is hardly processed. As the pressure-sensitive adhesive sheet is hardly processed as compared with the work, generation of decomposition residue due to ablation of pressure-sensitive adhesive sheet can be decreased. As a result, decomposition residue does not deposit between the work and the pressure-sensitive adhesive sheet, and contamination of so-called reverse side of processing can be suppressed. Hence, a method of manufacturing laser processed parts easily and at high production efficiency can be presented.

Further, aftertreatment such as wet desmearing in order to remove decomposition residue can be omitted. In addition, waste liquid treatment necessary in aftertreatment can be also skipped, and it contributes to reduction of environmental load. Moreover, since decomposition deposits can be decreased, a higher power of laser beam is enabled, and the through-put can be enhanced.

Besides, by using the laser beam of wavelength in ultraviolet region or laser beam capable of absorbing the light in ultraviolet region passing through multiple photon absorbing process, in the case of the work composed of, for example, macromolecular material, it is possible to process by photochemical ablation without resort to thermal process. As a result, edge portions are free from thermal damages, and the cut sections and openings can be machined more sharply, and the machining precision and reliability are enhanced. Moreover, as compared with infrared laser beam, local focusing is possible, and wide cutting allowance is not needed. Hence, dicing is possible at a narrower allowance than before.

The manufacturing method of laser processed parts of the invention is a manufacturing method of laser processed parts characterized by using a pressure-sensitive adhesive sheet for laser processing, irradiating the work with laser beam of wavelength in ultraviolet region or laser beam capable of absorbing the light in ultraviolet region passing through multiple photon absorbing process, and processing the work by ablation, in which at least a pressure-sensitive adhesive layer is provided on a base material as the pressure-sensitive adhesive sheet for laser processing, using a material of which refractive index is smaller than that of the work, and this method comprises a step of adhering the pressure-sensitive adhesive sheet for laser processing to the laser bean exit side of the work by way of the pressure-sensitive adhesive layer, a step of processing the work by irradiating the work with a laser beam of within 2 times of the irradiation intensity for forming a through-hole in the work, at higher than the irradiation intensity of threshold for inducing ablation of the work, and a step of peeling the pressure-sensitive adhesive sheet for laser processing from the work after the machining. The refractive index means herein an absolute refractive index. As the work, various materials may be used, including sheet material, circuit board, semiconductor wafer, glass substrate, ceramic substrate, metal substrate, light emitting or receiving element substrate of semiconductor laser, MEMS substrate, or semiconductor package.

The pressure-sensitive adhesive sheet has the refractive index of the base material smaller than the refractive index of the work.

By using the pressure-sensitive adhesive sheet having the refractive index of the base material smaller than the refractive index of the work, the deceleration rate of the speed of the laser beam propagating in the base material is smaller than in the work. Generation mechanism of laser ablation is derived from electron excitation by photon absorption, and hence as the deceleration rate declines, the probability of occurrence of photo absorption is lowered. That is, as the speed of the laser beam propagating through the medium picks up, it leads to drop of processability by laser beam. Hence, by using the pressure-sensitive adhesive sheet of which refractive index of base material is smaller than the refractive index of the work, the base material is harder to process than the work.

Therefore, if the work is irradiated with laser beam of more than the irradiation intensity of the threshold inducing ablation of the work, and within 2 times of the irradiation intensity for forming a through-hole in the work, the work is processed by laser but the pressure-sensitive adhesive sheet is hardly processed. As the pressure-sensitive adhesive sheet is hardly processed as compared with the work, generation of decomposition residue due to ablation of pressure-sensitive adhesive sheet can be decreased. As a result, decomposition residue does not deposit between the work and the pressure-sensitive adhesive sheet, and contamination of so-called reverse side of processing can be suppressed. Hence, a method of manufacturing laser processed parts easily and at high production efficiency can be presented.

Further, aftertreatment such as wet desmearing in order to remove decomposition residue can be omitted. In addition, waste liquid treatment necessary in aftertreatment can be also skipped, and it contributes to reduction of environmental load. Moreover, since decomposition deposits can be decreased, a higher power of laser beam is enabled, and the through-put can be enhanced.

Besides, by using the laser beam of wavelength in ultraviolet region or laser beam capable of absorbing the light in ultraviolet region passing through multiple photon absorbing process, in the case of the work composed of, for example, macromolecular material, it is possible to process by photochemical ablation without resort to thermal process. As a result, edge portions are free from thermal damages, and the cut sections and openings can be machined more sharply, and the machining precision and reliability are enhanced. Moreover, as compared with infrared laser beam, local focusing is possible, and wide cutting allowance is not needed. Hence, dicing is possible at a narrower allowance than before.

In a different aspect, the manufacturing method of laser processed parts of the invention is a manufacturing method of laser processed parts characterized by using a pressure-sensitive adhesive sheet for laser processing, irradiating the work with laser beam of wavelength in ultraviolet region or laser beam capable of absorbing the light in ultraviolet region passing through multiple photon absorbing process, and processing the work by ablation, in which at least a pressure-sensitive adhesive layer is provided on a base material as the pressure-sensitive adhesive sheet for laser processing, using a material of which ratio of density expressed in formula (2) is less than 1, and this method comprises a step of adhering the pressure-sensitive adhesive sheet for laser processing to the laser bean exit side of the work by way of the pressure-sensitive adhesive layer, a step of processing the work by irradiating the work with a laser beam of within 2 times of the irradiation intensity for forming a through-hole in the work, at higher than the irradiation intensity of threshold for inducing ablation of the work, and a step of peeling the pressure-sensitive adhesive sheet for laser processing from the work after the machining. The density in the invention refers to the mass density per unit volume.

$$\text{Ratio of density} = (\text{density of pressure-sensitive adhesive sheet for laser processing}) / (\text{density of work}) \quad (2)$$

As the work, various materials may be used, including sheet material, circuit board, semiconductor wafer, glass substrate, ceramic substrate, metal substrate, light emitting or receiving element substrate of semiconductor laser, MEMS substrate, or semiconductor package.

The pressure-sensitive adhesive sheet has the ratio of density expressed in formula (2) of less than 1.

By using the pressure-sensitive adhesive sheet having the density ratio of less than 1, as compared with the work, it is effective to lower the probability of laser beam colliding against the atoms per unit irradiation area of laser beam in the pressure-sensitive adhesive sheet. This is because the packing performance of molecules is smaller when the density is smaller. Hence, even by emitting laser beam, the photon absorption sectional area of the laser beam in the pressure-sensitive adhesive sheet can be set smaller than in the work. As a result, it is harder to process the pressure-sensitive adhesive sheet than the work.

Therefore, if the work is irradiated with laser beam of more than the irradiation intensity of the threshold inducing ablation of the work, and within 2 times of the irradiation intensity for forming a through-hole in the work, the work is processed by laser but the pressure-sensitive adhesive sheet is hardly processed. As the pressure-sensitive adhesive sheet is hardly processed as compared with the work, generation of decomposition residue due to ablation of pressure-sensitive adhesive sheet can be decreased. As a result, decomposition residue does not deposit between the work and the pressure-sensitive adhesive sheet, and contamination of so-called reverse side of processing can be suppressed. Hence, a method of manufacturing laser processed parts easily and at high production efficiency can be presented.

Further, aftertreatment such as wet desmearing in order to remove decomposition residue can be omitted. In addition, waste liquid treatment necessary in aftertreatment can be also skipped, and it contributes to reduction of environmental load. Moreover, since decomposition deposits can be decreased, a higher power of laser beam is enabled, and the through-put can be enhanced.

Besides, by using the laser beam of wavelength in ultraviolet region or laser beam capable of absorbing the light in ultraviolet region passing through multiple photon absorbing process, in the case of the work composed of, for example, macromolecular material, it is possible to process by photochemical ablation without resort to thermal process. As a result, edge portions are free from thermal damages, and the cut sections and openings can be machined more sharply, and the machining precision and reliability are enhanced. Moreover, as compared with infrared laser beam, local focusing is possible, and wide cutting allowance is not needed. Hence, dicing is possible at a narrower allowance than before.

In a further aspect, the manufacturing method of laser processed parts of the invention is a manufacturing method of laser processed parts characterized by using a pressure-sensitive adhesive sheet for laser processing, irradiating the work with laser beam of wavelength in ultraviolet region or laser beam capable of absorbing the light in ultraviolet region passing through multiple photon absorbing process, and processing the work by ablation, in which at least a pressure-sensitive adhesive layer is provided on a base material as the pressure-sensitive adhesive sheet for laser processing, using a material of which ratio of tensile strength expressed in formula (3) is less than 1, and this method comprises a step of adhering the pressure-sensitive adhesive sheet for laser processing to the laser bean exit side of the work by way of the pressure-sensitive adhesive layer, a step of processing the work by irradiating the work with a laser beam of within 2 times of the irradiation intensity for forming a through-hole in the work, at higher than the irradiation intensity of threshold for inducing ablation of the work, and a step of peeling the pressure-sensitive adhesive sheet for laser processing from the work after the machining $$\text{Ratio of tensile strength} = (\text{tensile strength of pressure-sensitive adhesive sheet for laser processing})/(\text{tensile strength of work}) \quad (3)$$

As the work, various materials may be used, including sheet material, circuit board, semiconductor wafer, glass substrate, ceramic substrate, metal substrate, light emitting or receiving element substrate of semiconductor laser, MEMS substrate, or semiconductor package.

The pressure-sensitive adhesive sheet has the ratio of tensile strength expressed in formula (3) of less than 1.

The present inventors found a correlation between the tensile strength of pressure-sensitive adhesive sheet having mechanical properties and its laser processing property, and discovered that contamination of work surface by decomposition products can be effectively suppressed by using the pressure-sensitive adhesive sheet of the ratio of tensile strength of less than 1. The reason of correlation between tensile strength and laser processing property is not clear. However, materials of smaller tensile strength are mostly included in the category of, for example, hydrocarbon polymers, and have a structure of high flexibility. Such structure seems to cause relaxation of energy if irradiated with laser beam so as to show difficulty in processing.

Therefore, by using the pressure-sensitive adhesive sheet having the tensile strength ratio of less than 1, smaller than that of the work, processing of the pressure-sensitive adhesive sheet is harder than that of the work.

More specifically, if the work is irradiated with laser beam of more than the irradiation intensity of the threshold inducing ablation of the work, and within 2 times of the irradiation intensity for forming a through-hole in the work, the work is processed by laser but the pressure-sensitive adhesive sheet is hardly processed. As the pressure-sensitive adhesive sheet is hardly processed as compared with the work, generation of decomposition residue due to ablation of pressure-sensitive adhesive sheet can be decreased. As a result, decomposition residue does not deposit between the work and the pressure-sensitive adhesive sheet, and contamination of so-called reverse side of processing can be suppressed. Hence, a method of manufacturing laser processed parts easily and at high production efficiency can be presented.

Further, aftertreatment such as wet desmearing in order to remove decomposition residue can be omitted. In addition, waste liquid treatment necessary in aftertreatment can be also skipped, and it contributes to reduction of environmental load. Moreover, since decomposition deposits can be decreased, a higher power of laser beam is enabled, and the through-put can be enhanced.

Besides, by using the laser beam of wavelength in ultraviolet region or laser beam capable of absorbing the light in ultraviolet region passing through multiple photon absorbing process, in the case of the work composed of, for example, macromolecular material, it is possible to process by photochemical ablation without resort to thermal process. As a result, edge portions are free from thermal damages, and the cut sections and openings can be machined more sharply, and the machining precision and reliability are enhanced. Moreover, as compared with infrared laser beam, local focusing is possible, and wide cutting allowance is not needed. Hence, dicing is possible at a narrower allowance than before.

In a different aspect, the manufacturing method of laser processed parts of the invention is a manufacturing method of laser processed parts characterized by using a pressure-sensitive adhesive sheet for laser processing, irradiating the work with laser beam of wavelength in ultraviolet region or laser beam capable of absorbing the light in ultraviolet region passing through multiple photon absorbing process, and processing the work by ablation, in which at least a pressure-sensitive adhesive layer is provided on a base material as the pressure-sensitive adhesive sheet for laser processing, using a material of which ratio of total coupling energy expressed in formula (4) is 1 or more, and this method comprises a step of adhering the pressure-sensitive adhesive sheet for laser processing to the laser bean exit side of the work by way of the pressure-sensitive adhesive layer, a step of processing the work by irradiating the work with a laser beam of within 2 times of the irradiation intensity for forming a through-hole in the work, at higher than the irradiation intensity of threshold for inducing ablation of the work, and a step of peeling the pressure-sensitive adhesive sheet for laser processing from the work after the machining $$\text{Ratio of total coupling energy} = (\text{total coupling energy } A \text{ of minimum value out of the total of coupling energy of one carbon atom in the resin component composing the base material and other atom coupling to this carbon atom/total coupling energy } B \text{ of minimum value out of the total of coupling energy of one carbon atom in the material component composing the work to be used and other atom coupling to this carbon atom}) \quad (4)$$

As the work, a sheet material can be used.

The pressure-sensitive adhesive sheet has the ratio of coupling energy expressed in formula (4) of 1 or more.

Therefore, by using the pressure-sensitive adhesive sheet having the total coupling energy ratio of 1 or more, processing of the pressure-sensitive adhesive sheet is harder than that of the work. More specifically, if the work is irradiated with laser beam of more than the irradiation intensity of the threshold inducing ablation of the work, and within 2 times of the irradiation intensity for forming a through-hole in the work, the work is processed by laser but the pressure-sensitive adhesive sheet is hardly processed. As the pressure-sensitive adhesive sheet is hardly processed as compared with the work, generation of decomposition residue due to ablation of pressure-sensitive adhesive sheet can be decreased. As a result, decomposition residue does not deposit between the work and the pressure-sensitive adhesive sheet, and contamination of so-called reverse side of processing can be suppressed. Hence, a method of manufacturing laser processed parts easily and at high production efficiency can be presented.

Further, aftertreatment such as wet desmearing in order to remove decomposition residue can be omitted. In addition, waste liquid treatment necessary in aftertreatment can be also skipped, and it contributes to reduction of environmental load. Moreover, since decomposition deposits can be decreased, a higher power of laser beam is enabled, and the through-put can be enhanced.

Besides, by using the laser beam of wavelength in ultraviolet region, in the case of the work composed of, for example, macromolecular material, it is possible to process by photochemical ablation without resort to thermal process. As a result, edge portions are free from thermal damages, and the cut sections and openings can be machined more sharply, and the machining precision and reliability are enhanced. Moreover, as compared with infrared laser beam, local focusing is possible, and wide cutting allowance is not needed. Hence, dicing is possible at a narrower allowance than before.

In a further aspect, the manufacturing method of laser processed parts of the invention is a manufacturing method of laser processed parts characterized by using a pressure-sensitive adhesive sheet for laser processing, irradiating the work with laser beam of wavelength in ultraviolet region or laser beam capable of absorbing the light in ultraviolet region passing through multiple photon absorbing process, and processing the work by ablation, in which at least a pressure-sensitive adhesive layer is provided on a base material as the pressure-sensitive adhesive sheet for laser processing, using a material of which ratio of specific heat expressed in formula (5) is 1 or more, and this method comprises a step of adhering the pressure-sensitive adhesive sheet for laser processing to the laser bean exit side of the work by way of the pressure-sensitive adhesive layer, a step of processing the work by irradiating the work with a laser beam of within 2 times of the irradiation intensity for forming a through-hole in the work, at higher than the irradiation intensity of threshold for inducing ablation of the work, and a step of peeling the pressure-sensitive adhesive sheet for laser processing from the work after the machining.

$$\text{Ratio of specific heat} = (\text{specific heat of pressure-sensitive adhesive sheet for laser processing})/(\text{specific heat of work}) \quad (5)$$

As the work, various materials may be used, including sheet material, circuit board, semiconductor wafer, glass substrate, ceramic substrate, metal substrate, light emitting or receiving element substrate of semiconductor laser, MEMS substrate, or semiconductor package.

The manufacturing method of laser processed parts of the invention is characterized by using a pressure-sensitive adhesive sheet for laser processing (hereinafter called pressure-sensitive adhesive sheet) having at least a pressure-sensitive adhesive layer provided on a base material. This pressure-sensitive adhesive sheet has the ratio of specific heat expressed in formula (5) of 1 or more.

Ablation is considered to have a mechanism of inducing coulombic explosion by exciting electrons of atoms of the work by photons, and a mechanism of decomposing thermally. Therefore, by using a pressure-sensitive adhesive sheet of which ratio of specific heat is 1 or more, the pressure-sensitive adhesive sheet has a smaller effect of thermal mechanism than the work. This is because if the specific heat is large, the temperature rise is suppressed if heat absorption is greater. Hence, it is harder to process the pressure-sensitive adhesive sheet than the work.

More specifically, if the work is irradiated with laser beam of more than the irradiation intensity of the threshold inducing ablation of the work, and within 2 times of the irradiation intensity for forming a through-hole in the work, the work is processed by laser but the pressure-sensitive adhesive sheet is hardly processed. As the pressure-sensitive adhesive sheet is hardly processed as compared with the work, generation of decomposition residue due to ablation of pressure-sensitive adhesive sheet can be decreased. As a result, decomposition residue does not deposit between the work and the pressure-sensitive adhesive sheet, and contamination of so-called reverse side of processing can be suppressed. Hence, a method of manufacturing laser processed parts easily and at high production efficiency can be presented.

Further, aftertreatment such as wet desmearing in order to remove decomposition residue can be omitted. In addition, waste liquid treatment necessary in aftertreatment can be also skipped, and it contributes to reduction of environmental load. Moreover, since decomposition deposits can be decreased, a higher power of laser beam is enabled, and the through-put can be enhanced.

Besides, by using the laser beam of wavelength in ultraviolet region or laser beam capable of absorbing the light in ultraviolet region passing through multiple photon absorbing process, in the case of the work composed of, for example, macromolecular material, it is possible to process by photo-chemical ablation without resort to thermal process. As a result, edge portions are free from thermal damages, and the cut sections and openings can be machined more sharply, and the machining precision and reliability are enhanced. Moreover, as compared with infrared laser beam, local focusing is possible, and wide cutting allowance is not needed. Hence, dicing is possible at a narrower allowance than before.

In a further aspect, the manufacturing method of laser processed parts of the invention is a manufacturing method of laser processed parts characterized by using a pressure-sensitive adhesive sheet for laser processing, irradiating the work with laser beam of wavelength in ultraviolet region or laser beam capable of absorbing the light in ultraviolet region passing through multiple photon absorbing process, and processing the work by ablation, in which at least a pressure-sensitive adhesive layer is provided on a base material as the pressure-sensitive adhesive sheet for laser processing, using a material of which transmissivity in the absorption region of laser beam of 50% or more, and this method comprises a step of adhering the pressure-sensitive adhesive sheet for laser processing to the laser beam exit side of the work by way of the pressure-sensitive adhesive layer, a step of processing the work by irradiating the work with the laser beam, and a step of peeling the pressure-sensitive adhesive sheet for laser processing from the work after the machining.

As the work, various materials may be used, including sheet material, circuit board, semiconductor wafer, glass substrate, ceramic substrate, metal substrate, light emitting or receiving element substrate of semiconductor laser, MEMS substrate, or semiconductor package.

The manufacturing method of laser processed parts of the invention is characterized by using a pressure-sensitive adhesive sheet for laser processing (hereinafter called pressure-sensitive adhesive sheet) having at least a pressure-sensitive adhesive layer provided on a base material. This pressure-sensitive adhesive sheet has the transmissivity to the laser beam of 50% or more.

By using the pressure-sensitive adhesive sheet having the transmissivity of 50% or more, the amount of laser energy accumulated per unit volume of pressure-sensitive adhesive sheet is set smaller than in the work. As a result, it is harder to process the pressure-sensitive adhesive sheet than the work.

If it is harder to process the pressure-sensitive adhesive sheet than the work, generation of decomposition residue due to ablation of pressure-sensitive adhesive sheet can be decreased. As a result, decomposition residue does not deposit between the work and the pressure-sensitive adhesive sheet, and contamination of so-called reverse side of processing can be suppressed. Hence, a method of manufacturing laser processed parts easily and at high production efficiency can be presented.

Further, aftertreatment such as wet desmearing in order to remove decomposition residue can be omitted. In addition, waste liquid treatment necessary in aftertreatment can be also skipped, and it contributes to reduction of environmental load. Moreover, since decomposition deposits can be decreased, a higher power of laser beam is enabled, and the through-put can be enhanced.

Besides, by using the laser beam of wavelength in ultraviolet region or laser beam capable of absorbing the light in ultraviolet region passing through multiple photon absorbing process, in the case of the work composed of, for example, macromolecular material, it is possible to process by photo-chemical ablation without resort to thermal process. As a result, edge portions are free from thermal damages, and the cut sections and openings can be machined more sharply, and the machining precision and reliability are enhanced. Moreover, as compared with infrared laser beam, local focusing is possible, and wide cutting allowance is not needed. Hence, dicing is possible at a narrower allowance than before.

In a further aspect, the manufacturing method of laser processed parts of the invention is a manufacturing method of laser processed parts characterized by using a pressure-sensitive adhesive sheet for laser processing, irradiating the work made of a metal material with laser beam of wavelength in ultraviolet region or laser beam capable of absorbing the light in ultraviolet region passing through multiple photon absorbing process, and processing the work by ablation, in which at least a pressure-sensitive adhesive layer is provided on a base material as the pressure-sensitive adhesive sheet for laser processing, using a material of which absorption coefficient of laser beam of wavelength of 355 nm is less than 20 cm$^{-1}$, and this method comprises a step of adhering the pressure-sensitive adhesive sheet for laser processing to the laser beam exit side of the work by way of the pressure-sensitive adhesive layer, a step of processing the work by irradiating the work with the laser beam of within 2 times of the irradiation intensity for forming a through-hole in the work, at higher than the irradiation intensity of threshold for inducing ablation of the work, and a step of peeling the pressure-sensitive adhesive sheet for laser processing from the work after the machining. As the work, a semiconductor wafer or metal substrate may be used.

When the manufacturing method of laser processed parts of the invention is applied in the work made of metal material, the pressure-sensitive adhesive sheet should have an absorption coefficient of laser beam of wavelength of 355 nm of less than 20 cm$^{-1}$. The absorption coefficient of the work made of metal material is about 5×10$^7$ cm$^{-1}$ in the laser beam of wavelength of 355 nm. That is, since the absorption coefficient of the pressure-sensitive adhesive sheet is smaller than the absorption coefficient of the work, it is harder to process the pressure-sensitive adhesive sheet than the work same as in the foregoing examples. In this constitution, it is effective to suppress presence of decomposition residue from the pressure-sensitive adhesive sheet between the work and the pressure-sensitive adhesive sheet, that is, contamination of the reverse side of machining.

Further, aftertreatment for removing decomposition residue can be omitted, and waste liquid treatment necessary in aftertreatment can be also skipped. As a result, it contributes to reduction of environmental load. Moreover, since decomposition deposits can be decreased, a higher power of laser beam is enabled, and the through-put can be enhanced.

Besides, by using the laser beam of wavelength in ultraviolet region or laser beam capable of absorbing the light in ultraviolet region passing through multiple photon absorbing process, as compared with infrared laser beam, local focusing is possible, and wide cutting allowance is not needed. Hence, dicing is possible at a narrower allowance than before.

In a further aspect, the manufacturing method of laser processed parts of the invention is a manufacturing method of laser processed parts characterized by using a pressure-sensitive adhesive sheet for laser processing, irradiating the work made of a metal material with laser beam of wavelength in ultraviolet region or laser beam capable of absorbing the light in ultraviolet region passing through multiple photon absorbing process, and processing the work by ablation, in which at least a pressure-sensitive adhesive layer is provided on a base material as the pressure-sensitive adhesive sheet for laser processing, using a material of which refractive index is less than 1.53, and this method comprises a step of adhering the pressure-sensitive adhesive sheet for laser processing to the laser beam exit side of the work by way of the pressure-sensitive adhesive layer, a step of processing the work by irradiating the work with the laser beam of within 2 times of the irradiation intensity for forming a through-hole in the work, at higher than the irradiation intensity of threshold for inducing ablation of the work, and a step of peeling the pressure-sensitive adhesive sheet for laser processing from the work after the machining. As the work, a semiconductor wafer or metal substrate may be used.

When the manufacturing method of laser processed parts of the invention is applied in the work made of metal material, the pressure-sensitive adhesive sheet should have a refractive index of less than 1.53. The refractive index of the work made of metal material is about more than 2 in its material. That is, since the refractive index of the pressure-sensitive adhesive sheet is smaller than the refractive index of the work, it is harder to process the pressure-sensitive adhesive sheet than the work same as in the foregoing examples. In this constitution, it is effective to suppress presence of decomposition residue from the pressure-sensitive adhesive sheet between the work and the pressure-sensitive adhesive sheet, that is, contamination of the reverse side of machining.

Further, aftertreatment for removing decomposition residue can be omitted, and waste liquid treatment necessary in aftertreatment can be also skipped. As a result, it contributes to reduction of environmental load. Moreover, since decomposition deposits can be decreased, a higher power of laser beam is enabled, and the through-put can be enhanced.

Besides, by using the laser beam of wavelength in ultraviolet region or laser beam capable of absorbing the light in ultraviolet region passing through multiple photon absorbing process, as compared with infrared laser beam, local focusing is possible, and wide cutting allowance is not needed. Hence, dicing is possible at a narrower allowance than before.

In a further aspect, the manufacturing method of laser processed parts of the invention is a manufacturing method of laser processed parts characterized by using a pressure-sensitive adhesive sheet for laser processing, irradiating the work made of a metal material with laser beam of wavelength in ultraviolet region or laser beam capable of absorbing the light in ultraviolet region passing through multiple photon absorbing process, and processing the work by ablation, in which at least a pressure-sensitive adhesive layer is provided on a base material as the pressure-sensitive adhesive sheet for laser processing, using a material of which density is less than 1.1 g/cm$^3$, with the ratio of density expressed in formula (2) being less than 1 and this method comprises a step of adhering the pressure-sensitive adhesive sheet for laser processing to the laser beam exit side of the work by way of the pressure-sensitive adhesive layer, a step of processing the work by irradiating the work with the laser beam of within 2 times of the irradiation intensity for forming a through-hole in the work, at higher than the irradiation intensity of threshold for inducing ablation of the work, and a step of peeling the pressure-sensitive adhesive sheet for laser processing from the work after the machining.

$$\text{Ratio of density} = (\text{density of pressure-sensitive adhesive sheet for laser processing})/(\text{density of the work}) \quad (2)$$

As the work, a semiconductor wafer or metal substrate may be used.

When the manufacturing method of laser processed parts of the invention is applied in the work made of metal material, the pressure-sensitive adhesive sheet should have a density of less than 1.1 g/cm$^3$ and a ratio of density of less than 1. By laser ablation using such pressure-sensitive adhesive sheet, it is harder to process the pressure-sensitive adhesive sheet than the work. In this constitution, it is effective to decrease generation of decomposition residue of the pressure-sensitive adhesive sheet by ablation, and contamination of the reverse side of machining can be suppressed. As a result, a method of manufacturing laser processed parts easily and at high production efficiency can be presented.

Further, aftertreatment for removing decomposition residue can be omitted, and waste liquid treatment necessary in aftertreatment can be also skipped. As a result, it contributes to reduction of environmental load. Moreover, since decomposition deposits can be decreased, a higher power of laser beam is enabled, and the through-put can be enhanced.

Besides, by using the laser beam of wavelength in ultraviolet region or laser beam capable of absorbing the light in ultraviolet region passing through multiple photon absorbing process, as compared with infrared laser beam, local focusing is possible, and wide cutting allowance is not needed. Hence, dicing is possible at a narrower allowance than before.

In a further aspect, the manufacturing method of laser processed parts of the invention is a manufacturing method of laser processed parts characterized by using a pressure-sensitive adhesive sheet for laser processing, irradiating the work made of a metal material with laser beam of wavelength in ultraviolet region or laser beam capable of absorbing the light in ultraviolet region passing through multiple photon absorbing process, and processing the work by ablation, in which at least a pressure-sensitive adhesive layer is provided on a base material as the pressure-sensitive adhesive sheet for laser processing, using a material of which tensile strength is less than 100 MPa, and this method comprises a step of adhering the pressure-sensitive adhesive sheet for laser processing to the laser bean exit side of the work by way of the pressure-sensitive adhesive layer, a step of processing the work by irradiating the work with the laser beam of within 2 times of the irradiation intensity for forming a through-hole in the work, at higher than the irradiation intensity of threshold for inducing ablation of the work, and a step of peeling the pressure-sensitive adhesive sheet for laser processing from the work after the machining.

As the work, a semiconductor wafer or metal substrate may be used.

When the manufacturing method of laser processed parts of the invention is applied in the work made of metal material, the pressure-sensitive adhesive sheet should have a tensile strength of less than 100 MPa. A general metal material has a tensile strength of 100 MPa or less, by using the pressure-sensitive adhesive sheet having a tensile strength of less than 100 MPa, and selecting so that the tensile strength ratio may be less than 1, same as in the foregoing examples, it is harder to process the pressure-sensitive adhesive sheet than the work. In this constitution, it is effective to suppress presence of decomposition residue from the pressure-sensitive adhesive sheet between the work and the pressure-sensitive adhesive sheet, that is, contamination of the reverse side of machining.

Further, aftertreatment for removing decomposition residue can be omitted, and waste liquid treatment necessary in aftertreatment can be also skipped. As a result, it contributes to reduction of environmental load. Moreover, since decomposition deposits can be decreased, a higher power of laser beam is enabled, and the through-put can be enhanced.

Besides, by using the laser beam of wavelength in ultraviolet region or laser beam capable of absorbing the light in ultraviolet region passing through multiple photon absorbing process, as compared with infrared laser beam, local focusing is possible, and wide cutting allowance is not needed. Hence, dicing is possible at a narrower allowance than before.

In a further aspect, the manufacturing method of laser processed parts of the invention is a manufacturing method of laser processed parts characterized by using a pressure-sensitive adhesive sheet for laser processing, irradiating the work with laser beam of wavelength in ultraviolet region or laser beam capable of absorbing the light in ultraviolet region passing through multiple photon absorbing process, and processing the work by ablation, in which at least a pressure-sensitive adhesive layer is provided on a base material as the pressure-sensitive adhesive sheet for laser processing, using a material of which minimum value of group parameter of coupling energy of carbon atoms composing the base material and directly coupling atoms is 800 kJ/mol or more, and this method comprises a step of adhering the pressure-sensitive adhesive sheet for laser processing to the laser beam exit side of the work by way of the pressure-sensitive adhesive layer, a step of processing the work by irradiating the work with the laser beam of within 2 times of the irradiation intensity for forming a through-hole in the work, at higher than the irradiation intensity of threshold for inducing ablation of the work, and a step of peeling the pressure-sensitive adhesive sheet for laser processing from the work after the machining.

As the work, various materials may be used, including circuit board, glass substrate, ceramic substrate, semiconductor wafer, metal substrate, light emitting or receiving element substrate of semiconductor laser, MEMS substrate, or semiconductor package.

When the manufacturing method of laser processed parts of the invention is applied in the work made of metal material, for example, the pressure-sensitive adhesive sheet should have a total coupling energy of 800 kJ/mol or more. In the work made of metal material, the total coupling energy is less than 800 kJ/mol. That is, since the total coupling energy of the pressure-sensitive adhesive sheet is larger than the total coupling energy of the work, same as in the foregoing examples, it is harder to process the pressure-sensitive adhesive sheet than the work. In this constitution, it is effective to suppress presence of decomposition residue from the pressure-sensitive adhesive sheet between the work and the pressure-sensitive adhesive sheet, that is, contamination of the reverse side of machining.

Further, aftertreatment for removing decomposition residue can be omitted, and waste liquid treatment necessary in aftertreatment can be also skipped. As a result, it contributes to reduction of environmental load. Moreover, since decomposition deposits can be decreased, a higher power of laser beam is enabled, and the through-put can be enhanced.

Besides, by using the laser beam of wavelength in ultraviolet region, as compared with infrared laser beam, local focusing is possible, and wide cutting allowance is not needed. Hence, dicing is possible at a narrower allowance than before.

The step of processing the work includes a step of cutting or drilling the work.

In the manufacturing method of laser processed parts of the invention, as mentioned above, the pressure-sensitive adhesive sheet includes a pressure-sensitive adhesive layer for adhering and fixing the work. Therefore, if the specified region of the work is cut off at once, for example, the work (cut piece) is adhered and fixed to the pressure-sensitive adhesive layer. Hence, dropping of the work can be prevented, and handling is improved. Further, a technique of leaving part of the working area to prevent from dropping is not needed.

The pressure-sensitive adhesive sheet for laser processing of the invention is used in the manufacturing method of laser processed parts.

The manufacturing method of laser processed parts of the invention is a pressure-sensitive adhesive sheet for laser processing, irradiating the work with laser beam of wavelength in ultraviolet region, and processing the work by ablation, in which the pressure-sensitive adhesive sheet for laser processing is that at least a pressure-sensitive adhesive layer is provided on a base material, and ratio of etching (etching rate/energy fluence) of the base material is 0.4 [(μm/pulse)/(J/cm$^2$)] or less.

The pressure-sensitive adhesive sheet for laser processing is used in order to carry out laminating to the adsorption stage side (laser beam exit side) of a processed thing and to carry out support fixation of the processed products (laser processing products) at each process of the time of processing, and after that, before carrying out the laser processing of the processed thing by absorption-purple outside ABURESHON of laser light.

The ratio of etching which is the value which broke the etching rate (μm/pulse) of basis material by the energy fluence (J/cm$^2$) of the laser to be used shows the processability by laser beam of basis material, and shows what is hard to etch, so that this ratio of etching is small (it is hard to be processed).

In this invention, when the ratio of etching uses 0.4 or less basis material, etching of basis material can be controlled effectively and contamination of the processed thing surface by the decomposition thing of basis material or an adsorption board can be prevented.

Herein, the ratio of etching is preferred to be 0.2 or less, or more preferably 0.1 or less. If the ratio of etching is 0.4 or more, it is in the tendency for etching of basis material to become easy to advance. Therefore, there is a possibility that the decomposition products of the adsorption board formed on the decomposition products produced by etching of basis material or the adsorption stage etc. may enter into the interface portion of the pressure-sensitive adhesive sheet and the processed products, and may pollute the processed thing surface. When the processed products surface is polluted with the decomposition products, after carrying out the laser processing of the processed products, about the pressure-sensitive adhesive sheet, exfoliating from a processed thing becomes difficult, the decomposition thing removal by post-processing becomes difficult, or it is in the tendency for the processing accuracy of the processed products to fall.

As for said pressure-sensitive adhesive sheet for laser processing, a pressure-sensitive adhesive layer is prepared at least on basis material. By giving adhesiveness, it not only can fully carry out support fixation of the processed products, but since the adhesion of the interface of the pressure-sensitive adhesive sheet and the processed products can be raised, it becomes possible to be able to control invasion to the interface of a decomposition thing and to, control contamination of the processed thing surface by the decomposition thing as a result.

In this invention, as for the base material, it is preferable that it is polyolefin resin, polynorbornene resin, polyurethane resin or polyalkyleneglycol resin. As for the polyolefin resin, it is preferable that it is polyethylene. And said a functional group of the side chain of the polyolefin resin has connected with the main chain by methylene combination or eter combination. It becomes easy to adjust the ratio of etching of basis material by using said material as a formation material of basis material to 0.4 or less.

The manufacturing method of laser processed parts of the invention is the manufacturing method of laser processed parts of the invention is a manufacturing method of laser processed parts characterized by using a pressure-sensitive adhesive sheet parts in any one of claims 19 to 26 for laser processing, wherein a step (1) of adhering the pressure-sensitive adhesive sheet for laser processing to the laser beam exit side of the work by way of the pressure-sensitive adhesive layer, a step (2) of processing the work by irradiating the work with a laser beam, and a step (3) of peeling the pressure-sensitive adhesive sheet for laser processing from the work after the machining.

As the work, various materials may be used, including sheet material, circuit board, semiconductor wafer, glass substrate, ceramic substrate, metal substrate, light emitting or receiving element substrate of semiconductor laser, MEMS substrate, or semiconductor package.

The step of processing the work includes a step of cutting or drilling the work.

BEST MODE FOR CARRYING OUT THE INVENTION

First Exemplary Embodiment

Pressure-Sensitive Adhesive Sheet

Figure 1:
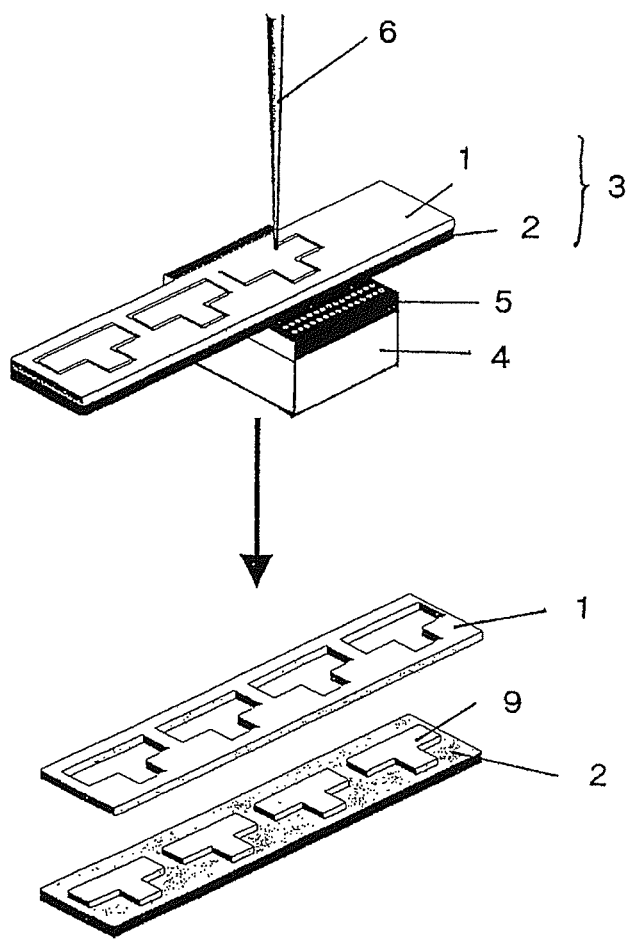
FIG. 1 is a schematic diagram explaining laser processing of the work according to an exemplary embodiment of the invention.

First of all, the pressure-sensitive adhesive sheet used in the first exemplary embodiment of the invention is explained. In the exemplary embodiment, the pressure-sensitive adhesive sheet is used when processing the work by ablation using laser beam of wavelength in ultraviolet region or laser beam capable of absorbing the light in ultraviolet region passing through multiple photon absorbing process. It is composed of at least a base material and a pressure-sensitive adhesive layer disposed thereon (the detail of the base material and adhesive layer is described later). More specifically, the pressure-sensitive adhesive sheet used in the exemplary embodiment includes seven modes, pressure-sensitive adhesives sheet A to G, as described below.

(Pressure-Sensitive Adhesive Sheet A)

Pressure-sensitive adhesive sheet A, when irradiated with a laser beam of within 2 times of the irradiation intensity for forming a through-hole in the work, at higher than the irradiation intensity of threshold for inducing ablation of the work, should have such physical properties that the ratio of light absorption coefficient expressed in formula (1) is less than 1.

Ratio of light absorption coefficient=(absorption coefficient of pressure-sensitive adhesive sheet $A$ for laser processing in light of wavelength of 355 nm)/(absorption coefficient of work in light of wavelength of 355 nm)     (1)

Ratio of light absorption coefficient is an important parameter for difference in processability between the pressure-sensitive adhesive sheet A and the work. The reason is as follows. That is, generally, when an absorption coefficient of a certain solid matter is small, it means that this solid matter can absorb less energy. On the other hand, light absorption in solid matter occurs in light invasion length (effective distance from solid surface (1/absorption coefficient)). When the absorption coefficient is small, the light invasion length is long, and the amount of heat accumulated per volume of solid matter is small. In other words, this solid matter is less likely to be processed by laser beam. Therefore, when the ratio of absorption coefficient is less than 1, it means that the pressure-sensitive adhesive sheet A is less likely to be processed than the work. From this viewpoint, the pressure-sensitive adhesive sheet A in this exemplary embodiment is useful for laser processing.

Herein, the ratio of absorption coefficient is preferred to be 0.9 or less, or more preferably 0.8 or less. If the ratio of absorption coefficient is 1 or more, the pressure-sensitive adhesive sheet is cut or drilled before the work is processed. As a result, the decomposition products from the pressure-sensitive adhesive sheet may be formed between the work and the pressure-sensitive adhesive sheet and the reverse side of machining may be contaminated. In this exemplary embodiment, since the ratio of absorption coefficient is less than 1, such problems will not take place.

(Pressure-Sensitive Adhesive Sheet B)

Pressure-sensitive adhesive sheet B, when irradiated with a laser beam of within 2 times of the irradiation intensity for forming a through-hole in the work, at higher than the irradiation intensity of threshold for inducing ablation of the work, should have such physical properties that the refractive index of the base material is smaller than the refractive index of the work.

Refractive index is an important parameter for difference in processability between the pressure-sensitive adhesive sheet B and the work. The reason is as follows. That is, generally, when a refractive index of a certain solid matter is small, it means that the deceleration degree of the speed of laser light propagating through this solid matter is small. On the other hand, since laser ablation is derived from electron excitation by photon absorption, if the propagating speed of laser beam in the solid matter is fast, electron excitation is less likely to occur. In other words, this solid matter is less likely to be processed by laser beam. Therefore, when the refractive index of the base material is smaller than the refractive index of the work, the pressure-sensitive adhesive sheet B is less likely to be processed than the work. From this viewpoint, the pressure-sensitive adhesive sheet B in this exemplary embodiment is useful for laser processing.

If the refractive index of the base material is larger than the refractive index of the work, the pressure-sensitive adhesive sheet is cut or drilled before the work is processed. As a result, the decomposition products from the pressure-sensitive adhesive sheet may be formed between the work and the pressure-sensitive adhesive sheet and the reverse side of machining may be contaminated. In this exemplary embodiment, having properties as stated herein, such problems will not take place.

(Pressure-Sensitive Adhesive Sheet C)

Pressure-sensitive adhesive sheet C, when irradiated with a laser beam of within 2 times of the irradiation intensity for forming a through-hole in the work, at higher than the irradiation intensity of threshold for inducing ablation of the work, should have such physical properties that the ratio of density expressed in formula (2) is less than 1.

Ratio of density=(density of pressure-sensitive adhesive sheet $C$ for laser processing)/(density of work) (2)

Ratio of density is an important parameter for difference in processability between the pressure-sensitive adhesive sheet C and the work. The reason is as follows. That is, generally, when a density of a certain solid matter is small, the packing rate of molecules (that is, filling rate per unit volume) is low, and probability of laser beam colliding against atoms per unit irradiation area is low. On the other hand, in the case of photochemical ablation, molecular coupling is segmented by excitation of electrons by photon absorption by ablation (for example, if the work is a macromolecular material). Hence, when the density is small, the photon absorption sectional area is small, and the solid matter is less likely to be processed by laser beam. Therefore, when the ratio of density is less than 1, it means that the pressure-sensitive adhesive sheet C is less likely to be processed than the work. From this viewpoint, the pressure-sensitive adhesive sheet C in this exemplary embodiment is useful for laser processing.

Herein, the ratio of density is preferred to be less than 0.8, or more preferably less than 0.6. If the ratio of density is 1 or more, the pressure-sensitive adhesive sheet is cut or drilled before the work is processed. As a result, the decomposition products from the pressure-sensitive adhesive sheet may be formed between the work and the pressure-sensitive adhesive sheet and the reverse side of machining may be contaminated. In this exemplary embodiment, since the ratio of density is less than 1, such problems will not take place.

(Pressure-Sensitive Adhesive Sheet D)

Pressure-sensitive adhesive sheet D, when irradiated with a laser beam of within 2 times of the irradiation intensity for forming a through-hole in the work, at higher than the irradiation intensity of threshold for inducing ablation of the work, should have such physical properties that the ratio of tensile strength expressed in formula (3) is less than 1.

Ratio of tensile strength=(tensile strength of pressure-sensitive adhesive sheet $D$ for laser processing)/(tensile strength of work) (3)

Ratio of tensile strength is an important parameter for difference in processability between the pressure-sensitive adhesive sheet D and the work. The reason is not clear, but a material of small tensile strength, such as hydrocarbon polymer, has a high flexibility. Such structure seems to alleviate energy if irradiated with laser beam to show difficulty in processing. Therefore, when the ratio of tensile strength is less than 1, the pressure-sensitive adhesive sheet D is less likely to be processed than the work, and seems to be useful for laser processing.

Herein, the ratio of tensile strength is preferred to be 0.9 or less, or more preferably 0.8 or less. If the ratio of tensile strength is 1 or more, the pressure-sensitive adhesive sheet is cut or drilled before the work is processed. As a result, the decomposition products from the pressure-sensitive adhesive sheet may be formed between the work and the pressure-sensitive adhesive sheet and the reverse side of machining may be contaminated. In this exemplary embodiment, since the ratio of tensile strength is less than 1, such problems will not take place.

(Pressure-Sensitive Adhesive Sheet E)

Pressure-sensitive adhesive sheet E, when irradiated with a laser beam of within 2 times of the irradiation intensity for forming a through-hole in the work, at higher than the irradiation intensity of threshold for inducing ablation of the work, should have such physical properties that the ratio of total coupling energy expressed in formula (4) is 1 or more.

Ratio of total coupling energy=(total coupling energy ratio=total coupling energy $A$ of minimum value out of the total of coupling energy of one carbon atom in the resin component composing the base material and other atom coupling to this carbon atom/total coupling energy $B$ of minimum value out of the total of coupling energy of one carbon atom in the material component composing the work to be used and other atom coupling to this carbon atom) (4)

The value (group parameter) of the total coupling energy A is cited from the reference document (Cox, J. D. and Pilcher, G., "Thermochemistry of organic and organometallic compounds," Academic Press, New York, 1970). Ratio of coupling energy is an important parameter for difference in processability between the pressure-sensitive adhesive sheet E and the work. The reason is as follows. That is, when the photon energy of laser beam of wavelength in ultraviolet region exceeds the coupling energy in polymer molecule, this photon energy seems to be a sufficient energy for segmenting the coupling. The present inventors have discovered a correlative relation between the weakest coupling energy in molecule and ablation phenomenon. The reason is not clear, but it seems that probability of segmenting coupling between atoms is lowered if the strong coupling energy portion is provided with energy by laser beam, and that the threshold of laser beam inducing ablation is heightened, thereby decreasing the chance of ablation. Specifically, when the minimum value of group parameter is large, the solid matter seems to be less likely to be processed by laser beam. Hence, if the coupling energy ratio is 1 or more, the pressure-sensitive adhesive sheet E is lower in processability than the work. From this viewpoint, the pressure-sensitive adhesive sheet E of the exemplary embodiment seems to be useful for laser processing.

Herein, the ratio of total coupling energy is preferred to be 1.2 or more, or more preferably 1.5 or more. If the ratio of total coupling energy is less than 1, the pressure-sensitive adhesive sheet is cut or drilled before the work is processed. As a result, the decomposition products from the pressure-sensitive adhesive sheet may be formed between the work and the pressure-sensitive adhesive sheet and the reverse side of machining may be contaminated. In this exemplary embodiment, since the ratio of total coupling energy is 1 or more, such problems will not take place.

(Pressure-Sensitive Adhesive Sheet F)

Pressure-sensitive adhesive sheet F, when irradiated with a laser beam of within 2 times of the irradiation intensity for forming a through-hole in the work, at higher than the irradiation intensity of threshold for inducing ablation of the work, should have such physical properties that the ratio of specific heat expressed in formula (5) is 1 or more.

Ratio of specific heat=(specific heat of pressure-sensitive adhesive sheet $F$ for laser processing)/(specific heat of work) (5)

Ratio of specific heat is an important parameter for difference in processability between the pressure-sensitive adhesive sheet F and the work. The reason is as follows. That is, when a specific heat of a certain solid matter is large, it means that the temperature rise is small if the solid matter absorbs heat. On the other hand, ablation is considered to have a mechanism of inducing coulombic explosion by exciting electrons of atoms of the work by photons, and a mechanism of decomposing thermally. Therefore, if the specific heat is large, the effect of the latter thermal mechanism is small. Hence, by setting the ratio of specific heat at 1 or more, the processability of the pressure-sensitive adhesive sheet F can be set lower than that of the work. Therefore, the pressure-sensitive adhesive sheet F of the invention seems to be useful for laser processing.

Herein, the ratio of specific heat is preferred to be 1.2 or more, or more preferably 1.5 or more. If the ratio of specific heat is less than 1, the pressure-sensitive adhesive sheet is cut or drilled before the work is processed. As a result, the decomposition products from the pressure-sensitive adhesive sheet may be formed between the work and the pressure-sensitive adhesive sheet and the reverse side of machining may be contaminated. In the exemplary embodiment, since the ratio of specific heat is 1 or more, such problems will not take place.

(Pressure-Sensitive Adhesive Sheet G)

Pressure-sensitive adhesive sheet G, when irradiated with a laser beam of within 2 times of the irradiation intensity for forming a through-hole in the work, at higher than the irradiation intensity of threshold for inducing ablation of the work, should have such physical properties that the light transmissivity of the pressure-sensitive adhesive sheet is 50% or more.

Light transmissivity is an important parameter for difference in processability between the pressure-sensitive adhesive sheet G and the work. The reason is as follows. That is, when a light transmissivity of a certain solid matter is large, it means that the energy absorption by the solid matter is small. When the energy absorption is small, the amount of heat accumulated per unit volume of the solid matter is small. That is, the solid matter is less likely to be processed by laser beam. Hence, when the light transmissivity is 50% or more, it means that the pressure-sensitive adhesive sheet G is less likely to be processed than the work. From this viewpoint, the pressure-sensitive adhesive sheet G of the exemplary embodiment seems to be useful for laser processing.

Herein, the light transmissivity is preferred to be 70% or more, or more preferably 90% or more. If the light transmissivity is less than 50%, the pressure-sensitive adhesive sheet is cut or drilled together with the work. As a result, the decomposition products from the pressure-sensitive adhesive sheet may be formed between the work and the pressure-sensitive adhesive sheet and the reverse side of machining may be contaminated due to residue of decomposition products derived from the adsorption plate in the processing apparatus. It also involves a problem of dropping of the work. In the exemplary embodiment, since the light transmissivity is 50% or more, such problems will not take place.

(Pressure-Sensitive Adhesive Sheet H)

Pressure-sensitive adhesive sheet H should have such physical properties that the ratio of etching (etching rate/energy fluence) of the base material is 0.4 [(µm/pulse)/(J/cm$^2$)] or less.

Ratio of etching is a parameter for processability by laser beam, and it is shown that it is hard to etch, so that the ratio of etching is small. The ratio of etching is the value which broke the etching rate (µm/pulse) of basis material by the energy fluence (J/cm$^2$) of the laser to be used.

In this invention, when the ratio of etching uses 0.4 or less basis material, etching of basis material can be controlled effectively and contamination of the processed thing surface by the decomposition products from basis material or an adsorption board can be prevented.

Herein, the ratio of etching is preferred to be 0.2 or less, or more preferably 0.1 or less. If the ratio of etching is 0.4 or more, it is in the tendency for etching of basis material to become easy to advance. Therefore, there is a possibility that the decomposition products of the adsorption board formed on the decomposition products produced by etching of basis material or the adsorption stage etc. may enter into the interface portion of the pressure-sensitive adhesive sheet and the processed products, and may pollute the processed thing surface. When the processed products surface is polluted with the decomposition products, after carrying out the laser processing of the processed products, about the pressure-sensitive adhesive sheet, exfoliating from a processed thing becomes difficult, the decomposition thing removal by post-processing becomes difficult, or it is in the tendency for the processing accuracy of the processed products to fall.

The base material used in the pressure-sensitive adhesive sheets A to G includes polyester, olefin derivative resins, and other plastic films and sheets, but is not limited to them alone. Specific examples are sheets composed of low density polyethylene, straight-chain low density polyethylene, high density polyethylene, drawn polypropylene, undrawn polypropylene, ethylene-propylene copolymer, ethylene-vinyl acetate copolymer, ethylene-(meth)acrylic acid copolymer, ethylene-ester (meth)acrylate copolymer, polyethylene terephthalate, polyethylene naphthalate, polystyrene, polycarbonate, polyimide, ionomer, fluoroplastic, and others.

The base material used in the pressure-sensitive adhesive sheets H include polyethylene terephthalate; polyethylene naphthalate; polystyrene; polycarbonate; polyimide; (meth) acrylic polymer; polyurethane resin; polynorbornene resin; polyalkyleneglycol resin such as polyethyleneglycol and polytetramethyleneglycol; silicone resin; polyolephine resin such as polyethylene, polypropylene, polybutadiene, polyvinyl alcohol and polymethylpentene, but is not limited to them alone.

Among the above mentioned examples the polyolephine resin is preferable, and it is preferable to use especially linear saturated hydrocarbon resin. The ratio of etching of the polyethylene that does not have a functional group to a side chain is very small, and especially the processability by laser beam is low. Therefore, generating of a polyethylene decomposition thing can be suppressed effectively.

Even if the polyolephine resin has a functional group to the side chain, when the functional group of a side chain has connected with the main chain by methylene combination (—CH$_2$—) or ether combination (—O—), compared with cases, such as polypropylene, polystyrene, etc. which side chain functional groups, such as a methyl group and a phenyl group, have connected with the main chain directly, the ratio of etching is small and its processability by laser beam is low. Therefore, generating of a polyethylene decomposition thing can be suppressed. Although the reason is not clear, methylene combination and ether combination can hold the distance of the main chain and a side chain to some extent as a spacer, and its distance, and the thermal relief nature of polymer and motility of polymer are considered to be related to laser processing nature.

A polyolephin resin which the functional group of a side chain has connected with the main chain by methylene combination or ether combination, the polymethylpentene, an ethylene-acetic acid vinyl copolymer, polyvinyl acetate, polyvinyl alcohol, etc. are mentioned.

Moreover, by using polyurethane resin, polynorbornene resin, or polyalkylene glychol resin as basis material, the ratio of etching can be made small and generating of the decomposition thing of basis material can be controlled. Although the reason is not clear, polyurethane resin and polynorbornene resin are amorphous resin, and polyalkylene glychol resin has ether combination to the main chain, and is considered that this amorphia and ether combination are related to laser processing nature.

The bas material may be a single layer or plural layers if processable on the whole. Various shapes such as membrane and mesh may be selected. Thickness of base material may be selected properly within a range not spoiling handling and working efficiency in each process such as adhesion with the work, cutting of the work, peeling of cut pieces or recovery. Usually, it is about 500 µm or less, preferably about 3 to 300 µm, or more preferably 5 to 260 µm. The surface of the base material may be treated by common process for enhancing adhesion or tightness with the adjacent layer such as adsorption stage. Such surface treatment includes chromate treatment, ozone exposure, flame exposure, high voltage electric impulse exposure, ionizing radiation treatment, other chemical and physical treatment, and coating treatment by undercoat paint (such as tacky substance as mentioned later).

When using the pressure-sensitive adhesive sheet G, meanwhile, the base material is not particularly required to have cutting performance for cutting means such as cutter used in cutting of the work. The base material must be composed of a material capable of passing more than a specified energy ray, and its transmissivity is usually preferred to be 50% or more, or more preferably 85% or more, though variable depending on the output of laser ray or spot irradiation time.

In the exemplary embodiment, the pressure-sensitive adhesive layer is composed of acrylic or rubber pressure-sensitive adhesive. The acrylic pressure-sensitive adhesive includes, for example, polymer of alkyl ester of (meth)acrylate, and acrylic polymer such as copolymer of alkyl ester of (meth) acrylate copolymerized with copolymerizing monomer for the purpose of improving, as required, adhesion, aggregation, or heat resistance.

Herein, the alkyl ester of (meth)acrylate refers to ester acrylate and/or ester methacrylate, and (meth) in the invention is meant all the same. Examples are polymers of methyl radical and ethyl radical, propyl radical and isopropyl radical, n-butyl radical and t-butyl radical, isobutyl radical and amyl radical, isoamyl radical and hexyl radical, heptyl radical and cyclohexyl radical, 2-ethyl hexyl radical and octyl radical, isooctyl radical and nonyl radical, isononyl radical and decyl radical, isodecyl radical and undecyl radical, lauryl radical and tridecyl radical, tetradecyl radical and stearyl radical, octadecyl radical and dodecyl radical, and others comprising one type or two or more types of (meth)acrylic acid having 30 carbon atoms or less and 4 to 18 straight-chain or branch alkyl radicals.

Other monomers capable of forming such polymers include, for example, acrylic acid and methacrylic acid, carboxyethylacrylate and carboxypentylacrylate, itaconic acid and maleic acid, fumaric acid and crotonic acid or other monomer containing carboxyl radical, maleic anhydride and itaconic anhydride or other monomer of acid anhydride, (meth)acrylic acid 2-hydroxyl ethyl and (meth)acrylic acid 2-hydroxyl propyl, (meth)acrylic acid 4-hydroxyl butyl and (meth)acrylic acid 6-hydroxylhexyl, (meth)acrylic acid 8-hydroxyoctyl and (meth)acrylic acid 10-hydroxyl decyl, (meth) acrylic acid 12-hydroxylauryl and (4-hydroxymethyl cyclohexyl)-methylacrylate or other monomer containing hydroxyl radical, styrene sulfonic acid and acrylic sulfonic acid, 2-(meth)acrylic amide-2-methyl propane sulfonic acid and (meth)acrylic amide propane sulfonic acid, sulfopropyl (meth)acrylate and (meth)acryloyl oxynaphthalene sulfonic acid or other monomer containing sulfonic acid radical, 2-hydroxy ethyl acryloyl phosphate or other monomer containing phosphoric acid radical, (meth)acrylic amide, (meth)acrylic acid N-hydroxymethyl amide, (meth)acrylic acid alkyl aminoalkyl ester (for example, dimethyl aminoethyl methacrylate), t-butyl aminoethyl methacrylate, etc.), N-vinyl pyrrolidone, acryloyl morphorine, vinyl acetate, styrene, acrylonitrile, etc.

In addition, for the purpose of crosslinking of acrylic polymer or the like, multifunctional monomers and the like may be added as required as monomer component for copolymerization. Examples of such monomer include hexane diol di(meth)acrylate and (poly)ethylene glycol di(meth)acrylate, (poly)propylene glycol di(meth)acrylate and neopentyl glycol di(meth)acrylate, pentaerythritol di(meth)acrylate and trimethylol propane tri(meth)acrylate, pentaerythritol hexatri (meth)acrylate and dipentaerythritol hexa(meth)acrylate, epoxy acrylate and polyester acrylate, urethane acrylate, and others. One type or two or more types of multifunctional monomer may be used. The amount of use is preferably 30 wt. % or less of the total monomer from the viewpoint of adhesive characteristics or the like, especially preferably 20 wt. % or less. The acrylic polymer may have photopolymerizable carbon-carbon double bond in its molecule. Aside from these components, known additives may be also contained, such as adhesion aid, antiaging agent, filler, or coloring matter. An acrylic polymer can be prepared by any appropriate method such as solution polymerization method, emulsification polymerization method, fluid polymerization method or suspension polymerization method by using monomer of one or two or more monomer components.

polymerization initiator include peroxide such as hydrogen peroxide, benzoyl peroxide, t-butylperoxide. Although using independently is desirable, it can also be used as a redox system polymerization initiator combining a reducing agent. The reducing agent, for example, include ionization salt such as sulfite salt, bisulfite, iron, copper, cobalt salt; amine such as triethanolamine; reducing sugar such as aldose, ketose. Moreover, an azo compound is also a desirable polymerization initiator. The azo compound include 2,2'-azobis-2-methylpropioamidinate, 2,2'-azobis-2,4' dimethylvaleronitrile, 2,2'-azobis-N,N'-dimethyleneisobutylamidinate, 2,2'-azobisisobutylonitrile, 2,2'-azobis-2-methyle-N-(2-hydroxyethyl) propionamide. Moreover, it is also possible to use two or more sorts of polymerization initiator, using them together. Usually Reaction temperature is about 50 to 85° C., and reaction time is about 1 to 8 hour. Moreover, in the above mentioned manufacturing process, a solution polymerization method is preferable. As a solvent of (meth) acrylic polymer, polar solvents, such as ethyl acetate and toluene, are used.

The acrylic polymer is preferred to be suppressed in the content of low molecular weight substance from the viewpoint of prevention of contamination on the work, and the number-average molecular weight of the acrylic polymer is preferably 300,000 or more, or more preferably 400,000 to s3,000,000.

Since the number average molecular weight of the (meth) acrylic polymer which is base polymer is raised, a cross-linking agent can also be suitably added to the above-mentioned pressure-sensitive adhesive layer.

The cross-linking agent includes polyisocyanate compound, epoxy c, aziridine aziridine, melamine resin, urea resin, anhydrous compound, polyamine, carboxylic polymer. When using the cross-linking agent, the amount used takes into consideration that peel adhesion does not fall too much.

The content of cross-linking agent is preferred to be 5 to 500 parts by weight in 100 parts by weight of base polymer, especially preferably 0.01 to 5 parts by weight. The pressure-sensitive adhesive agent which forms the pressure-sensitive adhesive layer can be made to contain additive agents of common use, such as various kinds of well-known adhesion grant agents, an antioxidant, a filler and colorant, conventionally besides the above-mentioned ingredient as occasion demands.

To prevent separation of chip when cutting and improve peeling property from the chip when peeling, the adhesive is preferred to be radiation curing type adhesive which is cured by ultraviolet ray or electron ray. When using a radiation curing type adhesive, since the pressure-sensitive adhesive layer is exposed to radiation after cutting step, the base material sheet is preferred to have a sufficient radiation transmissivity. As radiation curing type adhesive, any adhesive material having radiation curing type functional group such as carbon-carbon double bond may be used without any particular limitation.

The radiation curing type adhesive is prepared, for example, by blending the acrylic polymer with radiation curing monomer component or oligomer component. Examples of monomer component or oligomer component of radiation curing type to be blended include urethane; (meth)acrylate oligomer, trimethylol propane tri(meth)acrylate, tetramethylol methane tetra(meth)acrylate, tetraethylene glycol di(meth)acrylate, pentaerythritol tri(meth)acrylate, pentaerythritol tetra(meth)acrylate, dipentaerythritol monohydroxy penta(meth)acrylate, dipentaerythritol hexa(meth) acrylate, 1,4-butylene glycol di(meth)acrylate, 1,6-hexane diol (meth)acrylate, and other ester compounds of (meth) acrylate and polyhydric alcohol; 2-propenyl-3-butenyl cyanurate, tris(2-methacryloxy ethyl) isocyanurate, and other isocyanurate or isocyanurate compounds. The content of oligomer component is preferred to be 5 to 500 parts by weight in 100 parts by weight of main polymer (acrylic polymer), especially preferably 70 to 160 parts by weight.

In the radiation curing component monomer mixture, examples of photopolymerization initiator to be blended in ultraviolet ray curing type or the like include 4-(2-hydroxy ethoxy)phenyl (2-hydroxy-2-propyl) ketone, alpha-hydroxy-alpha, alpha-methyl acetophenone, methoxy acetophenone, 2,2-dimethoxy-2-2-saphenyl acetophenone, 2,2-diethoxy acetophenone, 1-hydroxy siurohexyl phenyl ketone, 2-methyl-1-(4-(methylthio)-phenylco-2-morpholinopropane-1, other acetophenone compounds, benzoin ethyl ether, benzoin isopropylether, anizoin methyl ether, other benzoin ether compounds, 2-methyl-2-hydroxypropiophenone, other alpha-ketol compounds, benzyl dimethyl ketal, other ketal compounds, 2-naphthalene sulfonyl chloride, other aromatic sulfonyl chloride compounds, 1-phenone-1,1-propane dione-2-(O-ethoxy carbonyl) oxime, other photoactive oxime compounds, benzophenone and benzoyl benzoic acid, 3,3-dimethyl-4-methoxybenzophenone, other benzophenone compounds, thioxanthone, 2-chlorothioxanthone, 2-methyl thioxanthone, 2,4-dimethyl thioxanthone, isopropyl thioxanthone, 2,4-dichlorothoixanthone, 2,4-diethyl thioxanthone, 2,4-diisopropyl thioxanthone, other thioxanthone compounds, and also camphor quinone, ketone halide, acyl phosphino oxide, acyl phosphoanate, etc.

The content of photopolymerization initiator is preferred to be 0.1 to 10 parts by weight in 100 parts by weight of base polymer (acrylic polymer), especially preferably 0.5 to 5 parts by weight.

Control of crosslinking density of the pressure-sensitive adhesive layer is realized by any proper method, including crosslinking method by using an appropriate crosslinking agent such as multifunctional isocyanate compound, epoxy compound, melamine compound, metal salt compound, metal chelate compound, amino resin compound, or peroxide, and crosslinking method by irradiation of energy ray by mixing low molecular compound having two or more carbon-carbon double bonds.

The pressure-sensitive adhesive layer can be provided on the base material by a known method. For example, it may be directly applied on the base material, or an adhesive formed on a sheet coated with parting agent may be transferred. The pressure-sensitive adhesive layer may be a single layer or a lamination of two or more layers. Separator may be prepared in the surface of the pressure-sensitive adhesive layer if needed.

The thickness of the pressure-sensitive adhesive layer may be properly selected in a range not separated from the work and the adherent. Usually it is about 5 to 300 µm, or preferably about 10 to 100 µm, or more preferably 20 to 60 µm.

The adhesion strength of the pressure-sensitive adhesive layer is 20 N/20 mm or less, preferably 0.001 to 10 N/20 mm, or more preferably 0.01 to 8 N/20 mm. These values are based on the adhesion to SUS304 at ordinary temperature (before laser irradiation) (90-degree peel strength, peeling speed 300 mm/min).

Separator is prepared if needed, in order to protect a label processing or the pressure-sensitive adhesive layer. The separator includes paper; synthetic resin films, such as polyethylene, polypropylene, and a polyethylene terephthalate.

In order to raise the exfoliation nature from the pressure-sensitive adhesive layer, exfoliation processing of siliconizing, long chain alkyl processing, fluorination may be performed to the surface of separator if needed. Moreover, if needed, ultraviolet ray penetration prevention processing etc. may be performed so that the pressure-sensitive adhesive sheet for laser processing may not react by the environmental ultraviolet ray. Usually, the thick of the separator is preferably about 10 to 200 µm, or more preferably 25 to 100 µm.

[Manufacturing Method of Laser Processed Parts]

The manufacturing method of laser processed parts according to the first exemplary embodiment of the invention is explained by retelling to FIG. 1 to FIG. 4. In the drawings, portions not particularly necessary for explanation are omitted, and certain portions are shown in magnified or reduced view for the ease of explanation.

The manufacturing method of laser processed parts according to the exemplary embodiment is characterized by using a pressure-sensitive adhesive sheet for laser processing (hereinafter called pressure-sensitive adhesive) having at least a pressure-sensitive adhesive layer provided on a base material, comprising a step of adhering the pressure-sensitive adhesive to the laser beam exit side of the work by way of the pressure-sensitive adhesive layer, a step of processing the work by irradiating the work with a laser beam of within 2 times of the irradiation intensity for forming a through-hole in the work, at higher than the irradiation intensity of threshold for inducing ablation of the work, and a step of peeling the pressure-sensitive adhesive sheet for laser processing from the work after the machining. As the pressure-sensitive adhesive sheet, any one of the pressure-sensitive adhesives sheet A to G describe above may be used.

The adhering step of the pressure-sensitive adhesive sheet and the work is realized by any know method using roll laminator, press, or the like. To adhere, a pressure-sensitive adhesive layer is adhered to the opposite side of the processing surface of the work.

The processing step of the work is laser processing of the work by using laser beam by ablation. In this process, it is preferred to use the laser beam of which wavelength is in ultraviolet region. It is more preferable to use laser beam inducing photochemical ablation without resort to thermal processing. It is further preferred to use a laser beam capable of cutting by focusing in a narrow width of 20 µm or less. By using such laser beam, thermal damage by laser processing can be avoided, and the precision of hole edge or cut section wall can be enhanced, and the appearance is improved.

The laser beam is preferred to be within 2 times of the irradiation intensity for forming a through-hole in the work, at higher than the irradiation intensity of threshold for inducing ablation of the work. It is preferred to use pulse laser.

Such laser beam is preferred to induce ablation by ultraviolet absorption of 400 nm or less. Specific examples are KrF excimer laser (oscillation wavelength 248 nm), XeCl excimer laser (308 nm), YAG laser third harmonic (355 nm) or fourth harmonic (266 nm), YLF (yttrium lithium fluoride) or YVO$_4$ (yttrium vanadiate) or other solid laser third harmonic or fourth harmonic, and other laser beam having oscillation wavelength at 400 nm or less. If the wavelength is over 400 nm, the laser may be preferably used if capable of absorbing light in ultraviolet region after the multiple photon absorption process, and capable of cutting in a width of 20 µm or less by multiple photon absorption ablation, such as titanium sapphire laser with wavelength around 750 nm to 800 nm and pulse width of $1e^{-9}$ sec (0.000000001 sec) or less.

When using fundamental wave (wavelength 1.06 µm) of YAG laser or ruby laser (wavelength 694 nm), if focused, the beam diameter can be reduced only to about 50 µm. On the other hand, as in the exemplary embodiment, when laser beam in ultraviolet region is used, the beam diameter can be further reduced (for example, about 20 µm). Therefore, wide allowance is not needed when cutting.

Figure 2:
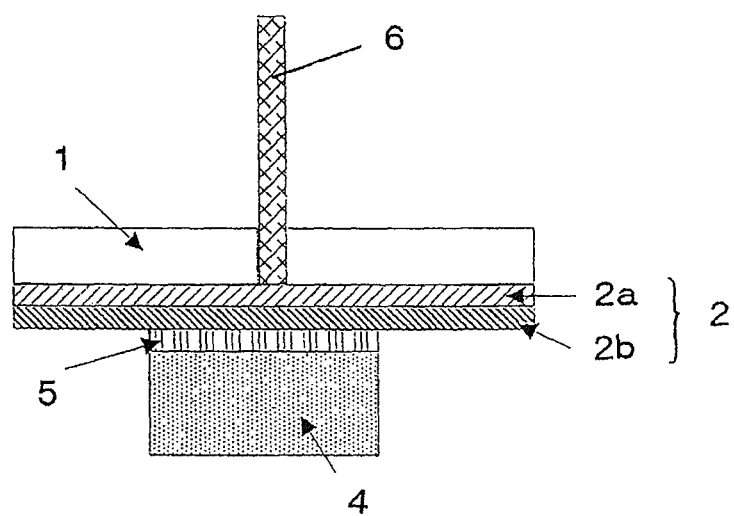
FIG. 2 is a schematic sectional view explaining laser processing according to the exemplary embodiment.

The processing in this step is shaping, for example, cutting, drilling, marking, grooving, scribing, or trimming. The cutting process is conducted as shown in FIG. 1 and FIG. 2. FIG. 1 is a schematic diagram explaining the cutting process of the work according to the exemplary embodiment. FIG. 2 is a sectional view showing the cutting process of the exemplary embodiment.

The work 3 shown in FIG. 1 and FIG. 2 is a laminated body of a workpiece 1 and a pressure-sensitive adhesive sheet 2. The pressure-sensitive adhesive sheet 2 is composed of a base material 2b and a pressure-sensitive adhesive layer 2a provided thereon. The workpiece 1 and pressure-sensitive adhesive sheet 2 are adhered by known method using roll laminator, press or the like. In the cutting process, the work 3 is fixed on a suction plate 5 of a suction stage 4. A laser beam 6 produced from a specified laser oscillator is focused by a lens, and emitted to the work. Simultaneously with emission, the laser emitting position is moved along the specified processing line, and cutting process is carried out. Cutting process includes laser machining using galvanoscan or X-Y stage scan, mask imaging laser process, and other known laser machining methods.

Laser processing condition is not particularly specified as far as the workpiece 1 can be cut off completely. That is, the optimum value of irradiation intensity can be determined on the basis of the ablation threshold of the material of the work. However, to avoid cutting of the pressure-sensitive adhesive sheet 2, it is preferred to be within 2 times of the processing condition for forming a through-hole in the workpiece 1. The cutting allowance can be narrowed by reducing the beam diameter of the focusing part of laser beam, but in order to enhance the cut section, it is preferred to satisfy the following condition.

$$\text{Beam diameter (µm)} > 2 \times (\text{laser beam moving speed (µm/sec)/laser repetition frequency (Hz)})$$

If the pressure-sensitive adhesive sheet 2 is not adhered to the reverse side of the workpiece 1, decomposition scraps from the workpiece 1 and suction stage 4 stick around the cut edge of the laser exit side of the laser processed part. Such contamination can be prevented by adhering the pressure-sensitive adhesive sheet 2 of the exemplary embodiment.

Figure 3:
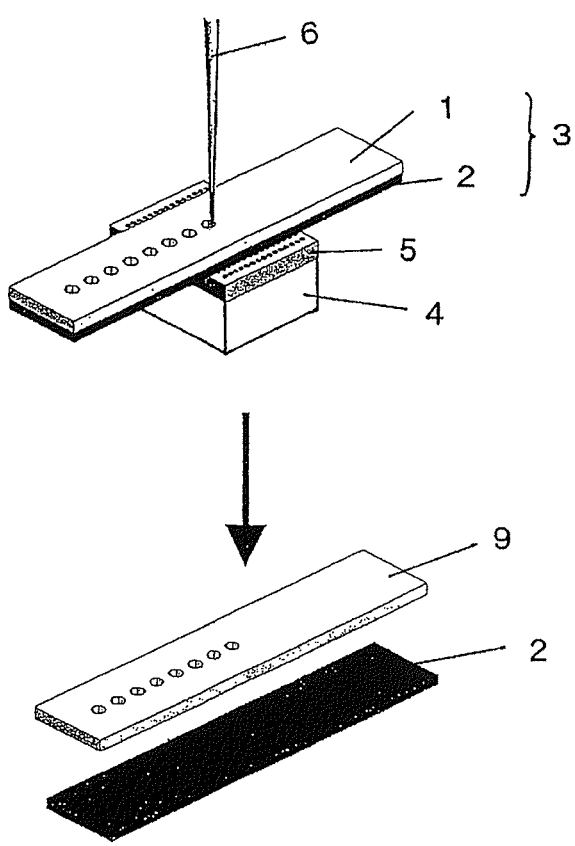
FIG. 3 is a schematic diagram explaining other laser processing of the work according to the exemplary embodiment.

Drilling process is conducted as shown in FIG. 3. FIG. 3 is a schematic diagram explaining the drilling process of the work in the exemplary embodiment. Drilling process includes laser machining using galvanoscan or X-Y stage scan, mask imaging punching process, and other known laser machining methods.

In this step, laser processable sheet or other pressure-sensitive adhesive sheet may be adhered to the laser incident side. Further, helium, nitrogen, oxygen or other gas may be blown to the machining area by using laser. As a result, residue on the work surface at the laser incident side can be removed easily.

Peeling process of the pressure-sensitive adhesive sheet is a step of peeling off the pressure-sensitive adhesive sheet from the work after machining (the laser processed part 9 shown in FIG. 2 and FIG. 3). Peeling method is not particularly specified, and any known method may be applied. However, it is preferred to avoid excessive stress to cause permanent deformation of the work when peeling. Therefore, from the viewpoint of elimination of stress, for example, a pressure-sensitive adhesive sheet lowered in adhesion by irradiation with radiation or heating may be used. Such pressure-sensitive adhesive sheet has both holding force when processing and ease of peeling. When a radiation curing type adhesive is used in the pressure-sensitive adhesive layer of the pressure-sensitive adhesive, the pressure-sensitive adhesive layer is cured and the adhesion is lowered by emitting radiation depending on the type of the adhesive. By irradiation with radiation, the adhesion of the pressure-sensitive adhesive layer is lowered by curing, and it is easier to peel. Irradiation means of radiation is not particularly specified, and, for example, ultraviolet ray is emitted.

Figure 4:
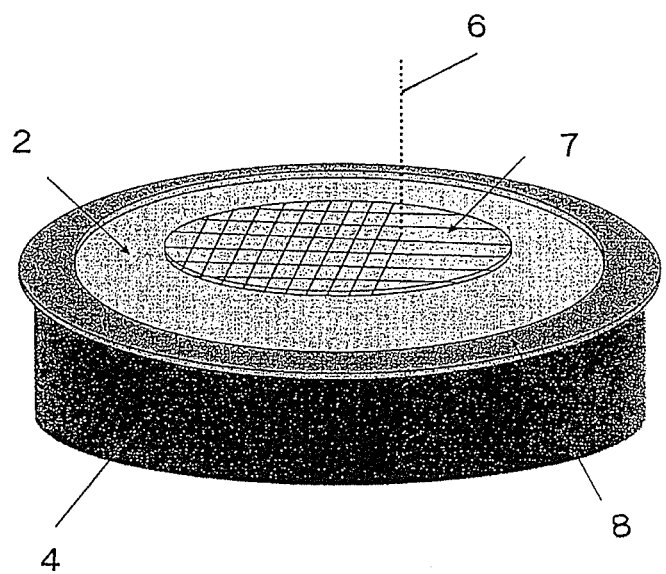
FIG. 4 is a schematic diagram showing an example of dicing method of semiconductor wafer.

In the case of cutting process (dicing) of semiconductor wafer, as shown in FIG. 4, one side of the semiconductor wafer (work) 7 is adhered to the pressure-sensitive adhesive sheet 2 for laser processing provided on the suction stage 4, and it is fixed to the dicing frame 8. A laser beam 6 produced from a specified laser oscillator is focused by a lens, and emitted to the semiconductor wafer 7, and the laser emitting position is moved along the specified processing line, and cutting process is carried out. Laser beam moving means includes galvanoscan or X-Y stage scan, mask, imaging, and other known laser machining methods. Processing condition of semiconductor wafer 7 is not particularly specified as far as the semiconductor wafer 7 is cut off and the pressure-sensitive adhesive sheet 2 is not cut off. A protective sheet may be provided at the laser beam incident side of the semiconductor wafer 7.

In such dicing process of semiconductor wafer 7, after cutting into individual semiconductor chips (laser processed parts), the individual semiconductor chips can be picked up and collected by a pickup method using a push-up pin called needle by a known device such as die bonder, or by a known method disclosed in Japanese Laid-open Patent No. 2001-118862.

In the exemplary embodiment, the work to be processed by laser is not particularly specified as far as it can be processed by laser by ablation, using laser beam. Applicable examples include sheet materials, circuit board, semiconductor wafer, glass substrate, ceramic substrate, metal substrate, semiconductor laser or other light emitting or receiving element substrates, MEMS (micro electro mechanical system) substrates, semiconductor packages, cloth, leather, paper or the like. Sheet materials include polyimide resin, polyester resin, epoxy resin, urethane resin, polystyrene resin, polyethylene resin, polyamide resin, polycarbonate resin, silicone resin, fluoroplastic resin, macromolecular film, nonwoven cloth, these resins provided with physical or optical functions by drawing process or impregnating process, copper, aluminum, stainless steel, other metal sheets, and polymer sheet and/or metal sheet laminated directly or by way of adhesive or the like. Circuit boards include one-side or both-side or multi-layer flexible printed board, rigid substrate made of glass epoxy, ceramics, metal core substrate or the like, and optical circuit or opto-electrical mixed circuit formed on glass or polymer. A specified pressure-sensitive adhesive is adhered to the opposite side of the laser irradiation surface of the work prepared in this manner.

When using the pressure-sensitive adhesive sheet E, of the above examples of the work, preferred examples are macromolecular film, nonwoven fabric, various sheet materials, or their resins provided with physical or optical function by drawing process or impregnating process, and also cloth, leather and paper.

Second Exemplary Embodiment

The second exemplary embodiment particularly relates to a mode of laser processing of the work made of metal material, in particular.

[Pressure-Sensitive Adhesive Sheet]

In this exemplary embodiment, six pressure-sensitive adhesive sheets A' to F' described below may be used. Detailed description is omitted as for constituent elements having same functions as the pressure-sensitive adhesive sheets in the first exemplary embodiment.

(Pressure-Sensitive Adhesive Sheet A')

Pressure-sensitive adhesive sheet A' differs from pressure-sensitive adhesive sheet A only in that the absorption coefficient of laser beam of wavelength of 355 nm is less than 20 $cm^{-1}$.

In the case of the work made of metal material, when pressure-sensitive adhesive sheet A' of the exemplary embodiment shows an absorption coefficient of less than 20 $cm^{-1}$ in the light of 355 nm, the pressure-sensitive adhesive sheet A' is less likely to be processed than the work.

A metal material generally shows an absorption coefficient of 1,000,000 $cm^{-1}$ or more. Therefore, concerning the invasion length of laser beam, it is longer in the pressure-sensitive adhesive sheet A' than in the metal material. Hence, if the pressure-sensitive adhesive sheet A' and the work are irradiated by same laser beam, the amount of heat accumulated per unit volume of pressure-sensitive adhesive sheet A' is smaller than in the work. As a result, it is harder to process than the work.

The absorption coefficient is preferred to be 100 $cm^{-1}$ or less, and more preferably 50 $cm^{-1}$ or less. It is because of the advantage that reaction by light is less likely to occur.

Metal materials include analogous metals. Specific examples include gold, SUS, copper, iron, aluminum, silicon, titanium, nickel, tungsten, and zirconia.

(Pressure-Sensitive Adhesive Sheet B')

Pressure-sensitive adhesive sheet B' differs from pressure-sensitive adhesive sheet B only in that the refractive index is 1.53 or less.

In the case of the work made of metal material, when pressure-sensitive adhesive sheet B' of the exemplary embodiment shows a refractive index of 1.53 or less, the pressure-sensitive adhesive sheet B' is less likely to be processed than the work. In the metal material, although it is hard to measure the refractive index, but it has been found that the pressure-sensitive adhesive sheet B' is less likely to be processed than the metal material when the base material of refractive index of 1.53 or less is used in the pressure-sensitive adhesive sheet B'. The refractive index of the pressure-sensitive adhesive sheet B' is preferred to be 1.5 or less, or more preferably 1.45 or less.

Metal materials include analogous metals. Specific examples include gold, SUS, copper, iron, aluminum, silicon, titanium, nickel, tungsten, and zirconia.

(Pressure-Sensitive Adhesive Sheet C')

Pressure-sensitive adhesive sheet C' differs from pressure-sensitive adhesive sheet C only in that the density is less than 1.1 g/cm$^3$, with the ratio of density of less than 1.

In the case of the work made of metal material, if the ratio of density is less than 1, decomposition residue may be formed between the pressure-sensitive adhesive sheet C' and the work. This is considered because the ablation mechanism differs between the macromolecular material and metal material. That is, in the case of metal material, thermochemical reaction process occurs due to heat generated by injection of laser energy. It is hence difficult to compare simply the processing efficiency of macromolecular material and the processing efficiency of metal material.

The present inventors compared the processing rate of metal material such as silicon and processing rate of pressure-sensitive adhesive sheet C', and discovered that the pressure-sensitive adhesive sheet C' is less likely to be processed than the work made of metal material when the density of the pressure-sensitive adhesive sheet C' is less than 1.1 g/cm$^3$ and the ratio of density is less than 1. By using such pressure-sensitive adhesive sheet C', decomposition residue due to metal material is not formed between the pressure-sensitive adhesive sheet C' and metal material.

The density of pressure-sensitive adhesive sheet C' is preferably less than 0.9 g/cm$^3$, or more preferably 0.7 g/cm$^3$.

Metal materials include analogous metals. Specific examples include gold, SUS, copper, iron, aluminum, silicon, titanium, nickel, tungsten, and zirconia.

(Pressure-Sensitive Adhesive Sheet D')

Pressure-sensitive adhesive sheet D' differs from pressure-sensitive adhesive sheet D only in that the tensile strength is less than 100 MPa.

In the case of the work made of metal material, when the pressure-sensitive adhesive sheet D' of the exemplary embodiment shows a tensile strength of less than 100 MPa in light of 355 nm, the pressure-sensitive adhesive sheet D' is less likely to be processed than the work.

Metal materials include analogous metals. Specific examples include gold, SUS, copper, iron, aluminum, silicon, titanium, nickel, tungsten, and zirconia.

(Pressure-Sensitive Adhesive Sheet E')

Pressure-sensitive adhesive sheet E' differs from pressure-sensitive adhesive sheet E only in that the minimum value of group parameter is 800 kJ/mol or more.

In the case of the work made of metal material, when the total coupling energy of the pressure-sensitive adhesive sheet E' of the exemplary embodiment is 800 kJ/mol or more, the pressure-sensitive adhesive sheet E' is less likely to be processed than the work. This is because the metal material generally has a total coupling energy of less than about 800 kJ/mol and the ratio of total coupling energy can be set at 1 or more.

More preferably, the total coupling energy should be 1000 kJ/mol or more, or more preferably 1200 kJ/mol or more. This is because segmenting of coupling by light energy is less likely to occur.

Metal materials include analogous metals. Specific examples include gold, SUS, copper, iron, aluminum, silicon, titanium, nickel, tungsten, and zirconia.

In the exemplary embodiment, the work to be processed by laser is not particularly specified as far as it can be processed by laser by ablation, using laser beam. Applicable examples include metal sheets of copper, aluminum, or stainless steel, and polymer sheet and metal sheet shown in the first exemplary embodiment laminated directly or by way of an adhesive or the like. Other examples are circuit board, semiconductor wafer, glass substrate, ceramic substrate, metal substrate, semiconductor laser or other light emitting or receiving element substrates, MEMS (micro electro mechanical system) substrates, semiconductor packages, and others. Circuit boards include one-side or both-side or multilayer flexible printed board, rigid substrate made of glass epoxy, ceramics, metal core substrate or the like, and optical circuit or opto-electrical mixed circuit formed on glass or polymer.

[Manufacturing Method of Laser Processed Parts]

In the manufacturing method of laser processed parts in the second exemplary embodiment of the invention, using pressure-sensitive adhesive sheets A' to E', it is same as in the manufacturing method in the first exemplary embodiment.

EXAMPLES

Examples of the invention are specifically described below, but it must be noted that the invention is not limited to these examples alone as far as not departing from the true spirit thereof.

Example 1

The following examples correspond to pressure-sensitive adhesive sheets A and A'.

Example 1-1

On a polyethylene film (base material) of 50 μm in thickness, a solution of acrylic pressure-sensitive adhesive which can be cured by ultraviolet ray was applied and dried to form a pressure-sensitive adhesive layer of 10 μm in thickness, and a pressure-sensitive adhesiveسheet was obtained. In this pressure-sensitive adhesive sheet, absorbance at 355 nm was measured by spectrophotometer (model U3410 of Hitachi, Ltd.), and absorption coefficient of 41 cm$^{-1}$ was obtained.

The solution of acrylic pressure-sensitive adhesive was prepared as follows. In 100 parts by weight of acrylic polymer (number-average molecular weight about 800,000) by copolymerization of butyl acrylate, ethyl acrylate, 2-hydroxy acrylate, and acrylic acid at a ratio by weight of 60/40/4/1, 90 parts by weight of dipentaerythritol monohydroxy pentacrylate as photopolymerizable compound, 5 parts by weight of benzyl dimethyl ketal (Irgacure 651) as photopolymerization initiator, and 2 parts by weight of polyisocyanate compound (Coronate L of Nihon Polyurethane) were mixed. The mixture was uniformly dissolved in toluene as organic solvent, and a solution of acrylic pressure-sensitive adhesive was prepared.

The number-average molecular weight of the synthesized acrylic polymer was measured in the following method. That is, the synthesized acrylic polymer was dissolved in THF at 0.1 wt %, the number-average molecular weight was measured by polystyrene conversion, using GPC (gel permeation chromatography). The measuring condition is as follows; GPC apparatus: HLC-8120GPC of Toso, column: (GMHHR-H)+(GMHHR-H)+(G2000HHR) of Toso, flow rate: 0.8 ml/min, concentration: 0.1 wt %, injection volume: 100 microliters, column temperature: 40° C., and eluant: THF.

Absorbance of polystyrene (thickness 100 µm) to be used as the work was measured, and absorption coefficient of 48 cm$^{-1}$ was obtained. The ratio of absorption coefficient of pressure-sensitive adhesive sheet/polystyrene was 0.85.

In succession, one side of polystyrene and pressure-sensitive adhesive were adhered by roll laminator with the pressure-sensitive adhesive layer set at adhesion side. It was put on an X-Y stage mounting a glass epoxy resin suction plate in the processing apparatus, with the work at the upper side. Further, third harmonic (355 nm) of YAG laser of average output of 5 W and repetition frequency of 30 kHz was focused by fθ lens into a diameter of 25 µm on the polystyrene surface, and it was cut by scanning laser beam at a speed of 20 mm/sec by galvano scanner. At this time, the pressure-sensitive adhesive sheet was not cut, and only the work was cut off. Peeling the pressure-sensitive adhesive sheet from the polystyrene, the periphery of the processed hole of the pressure-sensitive adhesive sheet adhering surface (laser exit side) was observed, but no deposit was found. Since the pressure-sensitive adhesive sheet was not cut off, contamination from the suction stage was not recognized.

Comparative Example 1-1

In comparison 1-1, the work was processed same as in example 1-1 except that laser processing was done without adhering pressure-sensitive adhesive sheet. The periphery of the cut section at the laser exit side of polystyrene (work) was observed, and lots of deposits of decomposition residue of polystyrene and decomposition residue of glass epoxy resin suction plate were observed.

Comparative Example 1-2

In comparison 1-2, the work was processed by laser same as in example 1-1 except that polyethylene terephthalate (or PET, thickness 100 µm) was used as pressure-sensitive adhesive sheet. Absorption coefficient of pressure-sensitive adhesive sheet made of PET base material was 80 cm$^{-1}$, and the ratio of absorption coefficient of pressure-sensitive adhesive sheet/work was 1.7.

After laser processing, the work and pressure-sensitive adhesive sheet were observed, and the polystyrene was cut off, but the pressure-sensitive adhesive sheet was heavily damaged, and foams including decomposition residue of pressure-sensitive adhesive sheet were formed between the pressure-sensitive adhesive sheet and polystyrene. Peeling the pressure-sensitive adhesive sheet, the periphery of the cut section at the laser exit side was observed, and lots of deposits of decomposition residue of polyethylene terephthalate were observed.

Example 1-2

In example 1-2, the work was processed by laser same as in example 1-1 except that a film (thickness 100 µm) of ethylene vinyl acetate copolymer was used as base material of pressure-sensitive adhesive sheet and that silicon wafer (thickness 100 µm) was used as the work. Absorption coefficient of pressure-sensitive adhesive sheet of film base material made of ethylene vinyl acetate copolymer was 19.8 cm$^{-1}$.

After laser processing, the work and pressure-sensitive adhesive sheet were observed, and the pressure-sensitive adhesive sheet was not cut, and only the work was cut off. Peeling the pressure-sensitive adhesive sheet, the periphery of the cut section of the pressure-sensitive adhesive adhering surface (laser exit side) was observed, but no deposit was found.

Example 1-3

In example 1-3, the work was processed by laser same as in example 1-1 except that a film (Dynaron HSBR of JSR Co., thickness 100 µm) of polypropylene/polybutadiene polymer was used as base material of pressure-sensitive adhesive sheet. Absorption coefficient of pressure-sensitive adhesive sheet of HSBR base material was 15 cm$^{-1}$.

After laser processing, the work and pressure-sensitive adhesive sheet were observed, and the pressure-sensitive adhesive sheet was not cut, and only the work was cut off. Peeling the pressure-sensitive adhesive sheet, the periphery of the cut section of the pressure-sensitive adhesive sheet adhering surface (laser exit side) was observed, but no deposit was found.

Example 2

The following examples correspond to pressure-sensitive adhesive sheets B and B'.

Example 2-1

On a polyvinyl alcohol film (base material) of 100 µm in thickness, a solution of acrylic pressure-sensitive adhesive which can be cured by ultraviolet ray was applied and dried to form a pressure-sensitive adhesive layer of 10 µm in thickness, and a pressure-sensitive adhesive sheet was obtained. In this pressure-sensitive adhesive sheet, refractive index was measured by Abbe refractometer, and 1.42 was obtained.

The solution of acrylic pressure-sensitive adhesive was prepared as follows. In 100 parts by weight of acrylic polymer (number-average molecular weight about 800,000) by copolymerization of butyl acrylate, ethyl acrylate, 2-hydroxy acrylate, and acrylic acid at a ratio by weight of 60/40/4/1, 90 parts by weight of dipentaerythritol monohydroxy pentacrylate as photopolymerizable compound, 5 parts by weight of benzyl dimethyl ketal (Irgacure 651) as photopolymerization initiator, and 2 parts by weight of polyisocyanate compound (Coronate L of Nihon Polyurethane) were mixed. The mixture was uniformly dissolved in toluene as organic solvent, and a solution of acrylic pressure-sensitive adhesive was prepared.

The number-average molecular weight of the synthesized acrylic polymer was measured in the following method. That is, the synthesized (meth)acrylic polymer was dissolved in THF at 0.1 wt %, the number-average molecular weight was measured by polystyrene conversion, using GPC (gel permeation chromatography). The measuring condition is as follows; GPC apparatus: HLC-8120GPC of Toso, column: (GMHHR-H)+(GMHHR-H)+(G2000HHR) of Toso, flow rate: 0.8 ml/min, concentration: 0.1 wt %, injection volume: 100 microliters, column temperature: 40° C., and eluant: THF.

Refractive index of polyimide (thickness 125 µm) to be used as the work was measured, and 1.65 was obtained.

In succession, one side of polyimide and pressure-sensitive adhesive were adhered by roll laminator with the pressure-sensitive adhesive layer set at adhesion side. It was put on an X-Y stage mounting a glass epoxy resin suction plate in the processing apparatus, with the work at the upper side. Further, third harmonic (355 nm) of YAG laser of average output of 5 W and repetition frequency of 30 kHz was focused by fθ lens into a diameter of 25 μm on the polystyrene surface, and it was cut by scanning laser beam at a speed of 20 mm/sec by galvano scanner. At this time, the pressure-sensitive adhesive sheet was not cut, and only the work was cut off. Peeling the pressure-sensitive adhesive sheet from the polyimide, the periphery of the processed hole of the pressure-sensitive adhesive sheet adhering surface (laser exit side) was observed, but no deposit was found. Since the pressure-sensitive adhesive sheet was not cut off, contamination from the suction stage was not recognized.

Comparative Example 2-1

In comparison 2-1, the work was processed same as in example 2-1 except that laser processing was done without adhering pressure-sensitive adhesive sheet. The periphery of the cut section at the laser exit side of polystyrene (work) was observed, and lots of deposits of decomposition residue of polyimide and decomposition residue of glass epoxy resin suction plate were observed.

Comparative Example 2-2

In comparison 2-2, the work was processed by laser same as in example 2-1 except that polyvinyl alcohol film (thickness 100 μm) was used as pressure-sensitive adhesive sheet.

After laser processing, the work and pressure-sensitive adhesive sheet were observed, and the polyimide was cut off, but the pressure-sensitive adhesive sheet was heavily damaged, and foams including decomposition residue of pressure-sensitive adhesive sheet were formed between the pressure-sensitive adhesive sheet and polystyrene. Peeling the pressure-sensitive adhesive sheet, the periphery of the cut section at the laser exit side was observed, and lots of deposits of decomposition residue of polyimide were observed.

Example 2-2

In example 2-2, the work was processed by laser same as in example 2-1 except that a film (thickness 100 μm) of polyvinyl alcohol was used as base material of pressure-sensitive adhesive sheet and that silicon wafer (thickness 75 μm) was used as the work. Refractive index of pressure-sensitive adhesive composed of polyvinyl alcohol as base material was 1.42.

After laser processing, the work and pressure-sensitive adhesive sheet were observed, and the pressure-sensitive adhesive sheet was not cut, and only the work was cut off. Peeling the pressure-sensitive adhesive sheet, the periphery of the cut section of the pressure-sensitive adhesive adhering surface (laser exit side) was observed, but no deposit was found.

Example 3

The following examples correspond to pressure-sensitive adhesive sheets C and C'.

Example 3-1

On a polybutadiene film (base material) of 100 μm in thickness, a solution of acrylic pressure-sensitive adhesive which can be cured by ultraviolet ray was applied and dried to form a pressure-sensitive adhesive layer of 10 μm in thickness, and a pressure-sensitive adhesive sheet was obtained. In this pressure-sensitive adhesive sheet, density was measured, and 0.94 g/cm$^3$ was obtained.

The solution of acrylic pressure-sensitive adhesive was prepared as follows. In 100 parts by weight of acrylic polymer (number-average molecular weight about 800,000) by copolymerization of butyl acrylate, ethyl acrylate, 2-hydroxy acrylate, and acrylic acid at a ratio by weight of 60/40/4/1, 90 parts by weight of dipentaerythritol monohydroxy pentacrylate as photopolymerizable compound, 5 parts by weight of benzyl dimethyl ketal (Irgacure 651) as photopolymerization initiator, and 2 parts by weight of polyisocyanate compound (Coronate L of Nihon Polyurethane) were mixed. The mixture was uniformly dissolved in toluene as organic solvent, and a solution of acrylic pressure-sensitive adhesive was prepared.

The number-average molecular weight of the synthesized acrylic polymer was measured in the following method. That is, the synthesized (meth)acrylic polymer was dissolved in THF at 0.1 wt %, the number-average molecular weight was measured by polystyrene conversion, using GPC (gel permeation chromatography). The measuring condition is as follows; GPC apparatus: HLC-8120GPC of Toso, column: (GMHHR-H)+(GMHHR-H)+(G2000HHR) of Toso, flow rate: 0.8 ml/min, concentration: 0.1 wt. %, injection volume: 100 microliters, column temperature: 40° C., and eluant: THF.

Density of polyurethane (thickness 100 μm) to be used as the work was measured, and 1.22 g/cm$^3$ was obtained. Ratio of density (density of pressure-sensitive adhesive sheet/density of polyurethane) was 0.77.

In succession, one side of polyurethane and pressure-sensitive adhesive sheet were adhered by roll laminator with the pressure-sensitive adhesive layer set at adhesion side. It was put on an X-Y stage mounting a glass epoxy resin suction plate in the processing apparatus, with the work at the upper side. Further, third harmonic (355 nm) of YAG laser of average output of 5 W and repetition frequency of 30 kHz was focused by fθ lens into a diameter of 25 μm on the polyurethane surface, and it was cut by scanning laser beam at a speed of 20 mm/sec by galvano scanner. At this time, the pressure-sensitive adhesive sheet was not cut, and only the work was cut off. Peeling the pressure-sensitive adhesive sheet from the polyurethane, the periphery of the processed hole of the pressure-sensitive adhesive sheet adhering surface (laser exit side) was observed, but no deposit was found. Since the pressure-sensitive adhesive sheet was not cut off, contamination from the suction stage was not recognized.

Comparative Example 3-1

In comparison 3-1, the work was processed same as in example 3-1 except that laser processing was done without adhering pressure-sensitive adhesive sheet. The periphery of the cut section at the laser exit side of polyurethane (work) was observed, and lots of deposits of decomposition residue of polyurethane and decomposition residue of glass epoxy resin suction plate were observed.

Comparative Example 3-2

In comparison 3-2, the work was processed by laser same as in example 3-1 except that polyimide (thickness 125 μm) was used as pressure-sensitive adhesive sheet. Density of pressure-sensitive adhesive sheet of base material made of polyimide was 1.47 g/cm$^3$, and ratio of density was 1.20.

After laser processing, the work and pressure-sensitive adhesive sheet were observed, and the polyurethane was cut off, but the pressure-sensitive adhesive sheet was heavily damaged, and foams including decomposition residue of pressure-sensitive adhesive sheet were formed between the pressure-sensitive adhesive sheet and polyurethane. Peeling the pressure-sensitive adhesive sheet, the periphery of the cut section at the laser exit side was observed, and lots of deposits of decomposition residue of polyimide were observed.

Example 3-2

In example 3-2, the work was processed by laser same as in example 3-1 except that a film (thickness 100 μm) of ethylene vinyl acetate copolymer was used as base material of pressure-sensitive adhesive sheet and that silicon wafer (thickness 75 μm) was used as the work. Density of pressure-sensitive adhesive sheet comprising ethylene vinyl acetate copolymer and silicon wafer was measured, and it was respectively 0.9 g/cm$^3$ and 2.35 g/cm$^3$. Ratio of density was 0.38.

After laser processing, the work and pressure-sensitive adhesive sheet were observed, and the pressure-sensitive adhesive sheet was not cut, and only the work was cut off. Peeling the pressure-sensitive adhesive sheet, the periphery of the cut section of the pressure-sensitive adhesive sheet adhering surface (laser exit side) was observed, but no deposit was found.

Example 4

The following examples correspond to pressure-sensitive adhesive sheets D and D'.

Example 4-1

On a polyethylene film (base material) of 50 μm in thickness, a solution of acrylic pressure-sensitive adhesive sheet which can be cured by ultraviolet ray was applied and dried to form a pressure-sensitive adhesive layer of 5 μm in thickness, and a pressure-sensitive adhesive sheet was obtained.

The solution of acrylic pressure-sensitive adhesive was prepared as follows. In 100 parts by weight of acrylic polymer (number-average molecular weight about 700,000) by copolymerization of butyl acrylate, ethyl acrylate, 2-hydroxy acrylate, and acrylic acid at a ratio by weight of 65/35/4/1, 90 parts by weight of dipentaerythritol monohydroxy pentacrylate as photopolymerizable compound, 5 parts by weight of benzyl dimethyl ketal (Irgacure 651) as photopolymerization initiator, and 2 parts by weight of polyisocyanate compound (Coronate L of Nihon Polyurethane) were mixed. The mixture was uniformly dissolved in toluene as organic solvent, and a solution of acrylic pressure-sensitive adhesive was prepared.

The number-average molecular weight of the synthesized acrylic polymer was measured in the following method. That is, the synthesized (meth) acrylic polymer was dissolved in THF at 0.1 wt %, the number-average molecular weight was measured by polystyrene conversion, using GPC (gel permeation chromatography). The measuring condition is as follows; GPC apparatus: HLC-8120GPC of Toso, column: (GMHHR-H)+(GMHHR-H)+(G2000HHR) of Toso, flow rate: 0.8 ml/min, concentration: 0.1 wt %, injection volume: 100 microliters, column temperature: 40° C., and eluant: THF.

In this pressure-sensitive adhesive sheet, tensile strength was measured by using Tensilon (Shimadzu Autograph AGS50-D). As a result, the tensile strength was 21 MPa. The measuring condition is as follows; sample width: 10 mm, speed: 50 mm/sec, chuck interval: 100 mm.

On the other hand, tensile strength was also measured in the polystyrene (thickness 100 μm) used as the work. As a result, the tensile strength was 44 MPa. Ratio of tensile strength was 0.48.

In succession, one side of polystyrene and pressure-sensitive adhesive sheet were adhered by roll laminator with the pressure-sensitive adhesive layer set at adhesion side. It was put on an X-Y stage mounting a glass epoxy resin suction plate in the processing apparatus, with the work at the upper side. Further, third harmonic (355 nm) of YAG laser of average output of 5 W and repetition frequency of 30 kHz was focused by fθ lens into a diameter of 25 μm on the polyurethane surface, and it was cut by scanning laser beam at a speed of 20 mm/sec by galvano scanner. At this time, the pressure-sensitive adhesive sheet was not cut, and only the work was cut off. Peeling the pressure-sensitive adhesive sheet from the polystyrene, the periphery of the processed hole of the pressure-sensitive adhesive sheet adhering surface (laser exit side) was observed, but no deposit was found. Since the pressure-sensitive adhesive sheet was not cut off, contamination from the suction stage was not recognized.

Comparative Example 4-1

In comparison 4-1, the work was processed same as in example 4-1 except that laser processing was done without adhering pressure-sensitive adhesive sheet. The periphery of the cut section at the laser exit side of polystyrene (work) was observed, and lots of deposits of decomposition residue of polystyrene and decomposition residue of glass epoxy resin suction plate were observed.

Comparative Example 4-2

In comparison 4-2, the work was processed by laser same as in example 4-1 except that polyethylene terephthalate (PET, thickness 100 μm) was used as pressure-sensitive adhesive sheet. Tensile strength of PET was 220 MPa, and ratio of tensile strength of pressure-sensitive adhesive sheet/work was 5.

After laser processing, the work and pressure-sensitive adhesive sheet were observed, and the polystyrene was cut off, but the pressure-sensitive adhesive sheet was heavily damaged, and foams including decomposition residue of pressure-sensitive adhesive sheet were formed between the pressure-sensitive adhesive sheet and polystyrene. Peeling the pressure-sensitive adhesive sheet, the periphery of the cut section at the laser exit side was observed, and lots of deposits of decomposition residue of polyethylene terephthalate were observed.

Example 4-2

In example 4-2, the work was processed by laser same as in example 4-1 except that a film (thickness 50 μm) of ethylene vinyl acetate copolymer was used as base material of pressure-sensitive adhesive sheet and that silicon wafer (thickness 100 μm) was used as the work. Tensile strength of pressure-sensitive adhesive of film of ethylene vinyl acetate copolymer was 17 MPa.

After laser processing, the work and pressure-sensitive adhesive sheet were observed, and the pressure-sensitive adhesive sheet was not cut, and only the work was cut off. Peeling the pressure-sensitive adhesive sheet, the periphery of the cut section of the pressure-sensitive adhesive sheet adhering surface (laser exit side) was observed, but no deposit was found.

Example 4-3

In example 4-3, the work was processed by laser same as in example 4-1 except that a film (thickness 100 μm) of three layers of polypropylene, polypropylene and polyethylene was used as base material of pressure-sensitive adhesive sheet. Tensile strength of pressure-sensitive adhesive sheet in example 4-3 was 35 MPa.

After laser processing, the work and pressure-sensitive adhesive sheet were observed, and the pressure-sensitive adhesive sheet was not cut, and only the work was cut off. Peeling the pressure-sensitive adhesive sheet, the periphery of the cut section of the pressure-sensitive adhesive sheet adhering surface (laser exit side) was observed, but no deposit was found.

Example 5

The following examples correspond to pressure-sensitive adhesive sheets E and E'.

Example 5-1

On a polyethylene film (base material) of 100 μm in thickness, a solution of acrylic pressure-sensitive adhesive sheet which can be cured by ultraviolet ray was applied and dried to form a pressure-sensitive adhesive layer of 10 μm in thickness, and a pressure-sensitive adhesive sheet was obtained.

The solution of acrylic pressure-sensitive adhesive was prepared as follows. In 100 parts by weight of acrylic polymer (number-average molecular weight about 800,000) by copolymerization of butyl acrylate, ethyl acrylate, 2-hydroxy acrylate, and acrylic acid at a ratio by weight of 60/40/4/1, 80 parts by weight of dipentaerythritol monohydroxy pentacrylate as photopolymerizable compound, 5 parts by weight of benzyl dimethyl ketal (Irgacure 184) as photopolymerization initiator, and 2 parts by weight of polyisocyanate compound (Coronate L of Nihon Polyurethane) were mixed. The mixture was uniformly dissolved in toluene as organic solvent, and a solution of acrylic pressure-sensitive adhesive was prepared.

The number-average molecular weight of the synthesized acrylic polymer was measured in the following method. That is, the synthesized (meth) acrylic polymer was dissolved in THF at 0.1 wt. %, the number-average molecular weight was measured by polystyrene conversion, using GPC (gel permeation chromatography). The measuring condition is as follows; GPC apparatus: HLC-8120GPC of Toso, column: (GMHHR-H)+(GMHHR-H)+(G2000HHR) of Toso, flow rate: 0.8 ml/min, concentration: 0.1 wt %, injection volume: 100 microliters, column temperature: 40° C., and eluant: THF.

In the polyethylene film, the minimum value of group parameter of coupling energy of carbon atoms, that is, the total coupling energy A was evaluated, and 1172 kJ/mol was obtained.

Further, group parameter of coupling energy of carbon atoms of polyimide (thickness 100 μm) used as the work, that is, the total coupling energy B was evaluated, and 692 kJ/mol was obtained. Ratio of total coupling energy of pressure-sensitive adhesive sheet/work was 1.7.

In succession, one side of polyimide and pressure-sensitive adhesive sheet were adhered by roll laminator with the pressure-sensitive adhesive layer set at adhesion side. It was put on an X-Y stage mounting a glass epoxy resin suction plate in the processing apparatus, with the work at the upper side. Further, third harmonic (355 nm) of YAG laser of average output of 5 W and repetition frequency of 30 kHz was focused by fθ lens into a diameter of 25 μm on the polyimide surface, and it was cut by scanning laser beam at a speed of 20 mm/sec by galvano scanner. At this time, the pressure-sensitive adhesive sheet was not cut, and only the work was cut off. Peeling the pressure-sensitive adhesive sheet from the polyimide, the periphery of the processed hole of the pressure-sensitive adhesive sheet adhering surface (laser exit side) was observed, but no deposit was found. Since the pressure-sensitive adhesive sheet was not cut off, contamination from the suction stage was not recognized.

Comparative Example 5-1

In comparison 5-1, the work was processed same as in example 5-1 except that laser processing was done without adhering pressure-sensitive adhesive sheet. The periphery of the cut section at the laser exit side of polyimide (work) was observed, and lots of deposits of decomposition residue of polyimide and decomposition residue of glass epoxy resin suction plate were observed.

Example 5-2

In example 5-2, the work was processed by laser same as in example 5-1 except that a film of polyurethane (thickness 100 μm) was used as base material of pressure-sensitive adhesive sheet. Total coupling energy A of polyurethane was 716 kJ/mol. Ratio of total coupling energy of pressure-sensitive adhesive sheet/work was 1.03.

After laser processing, the work and pressure-sensitive adhesive sheet were observed, and the pressure-sensitive adhesive sheet was not cut, and only the work was cut off. Peeling the pressure-sensitive adhesive sheet, the periphery of the cut section of the pressure-sensitive adhesive sheet adhering surface (laser exit side) was observed, but no deposit was found. Since the pressure-sensitive adhesive sheet was not cut off, contamination from the suction stage was not recognized.

Example 5-3

In example 5-3, the work was processed by laser same as in example 5-1 except that a film of polyethylene vinyl acetate copolymer (thickness 100 μm) was used as base material of pressure-sensitive adhesive sheet and a silicon wafer (thickness 100 μm) was used as work. Total coupling energy A of ethylene vinyl acetate copolymer was 962 kJ/mol.

After laser processing, the work and pressure-sensitive adhesive sheet were observed, and the pressure-sensitive adhesive sheet was not cut, and only the work was cut off. Peeling the pressure-sensitive adhesive sheet, the periphery of the cut section of the pressure-sensitive adhesive sheet adhering surface (laser exit side) was observed, but no deposit was found.

Example 5-4

In example 5-4, the work was processed by laser same as in example 5-3 except that a film of polymethyl pentene (thickness 100 μm) was used as base material of pressure-sensitive adhesive sheet. Total coupling energy A of polymethyl pentene film was 940 kJ/mol.

After laser processing, the work and pressure-sensitive adhesive sheet were observed, and the pressure-sensitive adhesive sheet was not cut, and only the work was cut off. Peeling the pressure-sensitive adhesive sheet, the periphery of the cut section of the pressure-sensitive adhesive sheet adhering surface (laser exit side) was observed, but no deposit was found.

Example 6

The following examples correspond to pressure-sensitive adhesive sheet F.

Example 6-1

A polyethylene film (base material) of 50 μm in thickness was measured by heat analysis system (DSC EXSTAR6000 of Seiko Instruments), and the specific heat was 2.3 J/g·K. On this base material, a solution of acrylic pressure-sensitive adhesive which can be cured by ultraviolet ray was applied and dried to form a pressure-sensitive adhesive layer of 10 μm in thickness, and a pressure-sensitive adhesive sheet was obtained.

The solution of acrylic pressure-sensitive adhesive was prepared as follows. In 100 parts by weight of acrylic polymer (number-average molecular weight about 700,000) by copolymerization of butyl acrylate, ethyl acrylate, 2-hydroxy acrylate, and acrylic acid at a ratio by weight of 65/35/4/1, 90 parts by weight of dipentaerythritol monohydroxy pentacrylate as photopolymerizable compound, 5 parts by weight of benzyl dimethyl ketal (Irgacure 651) as photopolymerization initiator, and 2 parts by weight of polyisocyanate compound (Coronate L of Nihon Polyurethane) were mixed. The mixture was uniformly dissolved in toluene as organic solvent, and a solution of acrylic pressure-sensitive adhesive was prepared.

The number-average molecular weight of the synthesized acrylic polymer was measured in the following method. That is, the synthesized (meth) acrylic polymer was dissolved in THF at 0.1 wt %, the number-average molecular weight was measured by polystyrene conversion, using GPC (gel permeation chromatography). The measuring condition is as follows; GPC apparatus: HLC-8120GPC of Toso, column: (GMHHR-H)+(GMHHR-H)+(G2000HHR) of Toso, flow rate: 0.8 ml/min, concentration: 0.1 wt %, injection volume: 100 microliters, column temperature: 40° C., and eluant: THF.

The specific heat of polyimide (thickness 100 μm) used as the work was measured, and 1.1 J/g·K was obtained. Ratio of specific heat of pressure-sensitive adhesive sheet/work was 2.1.

In succession, one side of polyimide and pressure-sensitive adhesive sheet were adhered by roll laminator with the pressure-sensitive adhesive layer set at adhesion side. It was put on an X-Y stage mounting a glass epoxy resin suction plate in the processing apparatus, with the work at the upper side. Further, third harmonic (355 nm) of YAG laser of average output of 5 W and repetition frequency of 30 kHz was focused by fθ lens into a diameter of 25 μm on the polyurethane surface, and it was cut by scanning laser beam at a speed of 20 mm/sec by galvano scanner. At this time, the pressure-sensitive adhesive sheet was not cut, and only the work was cut off. Peeling the pressure-sensitive adhesive sheet from the polystyrene, the periphery of the processed hole of the pressure-sensitive adhesive sheet adhering surface (laser exit side) was observed, but no deposit was found. Since the pressure-sensitive adhesive sheet was not cut off, contamination from the suction stage was not recognized.

Comparative Example 6-1

In comparison 6-1, the work was processed same as in example 6-1 except that laser processing was done without adhering pressure-sensitive adhesive sheet. The periphery of the cut section at the laser exit side of polyimide (work) was observed, and lots of deposits of decomposition residue of polyimide and decomposition residue of glass epoxy resin suction plate were observed.

Comparative Example 6-2

In comparison 6-2, the work was processed by laser same as in example 6-1 except that polyethylene terephthalate (PET, thickness 100 μm) was used as the pressure-sensitive adhesive sheet. The specific heat of PET was 0.36 J/g·K, and ratio of specific heat of pressure-sensitive adhesive sheet/ work was 0.33.

After laser processing, the work and pressure-sensitive adhesive sheet were observed, and the polystyrene was cut off, but the pressure-sensitive adhesive sheet was heavily damaged, and foams including decomposition residue of pressure-sensitive adhesive sheet were formed between the pressure-sensitive adhesive sheet and polystyrene. Peeling the pressure-sensitive adhesive sheet, the periphery of the cut section at the laser exit side was observed, and lots of deposits of decomposition residue of polyethylene terephthalate were observed.

Example 6-2

In example 6-2, the work was processed by laser same as in example 6-1 except that a film of ethylene vinyl acetate copolymer (thickness 70 μm) was used as base material of pressure-sensitive adhesive sheet. Specific heat of film of ethylene vinyl acetate copolymer was 2.2 J/g·K, and specific heat of silicon wafer was 0.77 J/g·K. Ratio of specific heat was 2.9.

After laser processing, the work and pressure-sensitive adhesive sheet were observed, and the pressure-sensitive adhesive sheet was not cut, and only the work was cut off. Peeling the pressure-sensitive adhesive sheet, the periphery of the cut section of the pressure-sensitive adhesive sheet adhering surface (laser exit side) was observed, but no deposit was found.

Example 6-3

In example 6-3, the work was processed by laser same as in example 6-1 except that a base material (thickness 100 μm) of three layers of polyethylene, polypropylene and polyethylene was used as base material of pressure-sensitive adhesive sheet. Specific heat of the base material was 1.4 J/g·K. Ratio of specific heat was 1.27.

After laser processing, the work and pressure-sensitive adhesive sheet were observed, and the pressure-sensitive adhesive sheet was not cut, and only the work was cut off. Peeling the pressure-sensitive adhesive sheet, the periphery of the cut section of the pressure-sensitive adhesive sheet adhering surface (laser exit side) was observed, but no deposit was found.

Example 7

The following examples correspond to pressure-sensitive adhesive sheet G.

Example 7-1

On a three-layer film (base material) of 100 μm in thickness consisting of polyethylene, polypropylene and polyethylene, a solution of acrylic pressure-sensitive adhesive which can be cured by ultraviolet ray was applied and dried to form a pressure-sensitive adhesive layer of 20 μm in thickness, and a pressure-sensitive adhesive sheet was obtained. In this base material, light transmissivity at 355 nm was measured, and 80.0% was obtained. In the pressure-sensitive adhesive sheet, light transmissivity at 355 nm was measured, and 78.9% was obtained. Light transmissivity was measured by using MPS-200 of Shimadzu Corporation, and the measuring range was 190 to 800 nm. Samples were cut in proper size, and the base material was measured from the adhesive applied side, and the pressure-sensitive adhesive sheet was measured from the pressure-sensitive adhesive layer side, and light transmissivity was obtained.

The solution of acrylic pressure-sensitive adhesive sheet was prepared as follows. In 100 parts by weight of acrylic polymer (number-average molecular weight about 800,000) by copolymerization of butyl acrylate, ethyl acrylate, 2-hydroxy acrylate, and acrylic acid at a ratio by weight of 60/40/4/1, 90 parts by weight of dipentaerythritol monohydroxy pentacrylate as photopolymerizable compound, and 5 parts by weight of benzyl dimethyl ketal (Irgacure 651) as photopolymerization initiator were mixed. The mixture was uniformly dissolved in toluene as organic solvent, and a solution of acrylic pressure-sensitive adhesive was prepared.

The number-average molecular weight of the synthesized acrylic polymer was measured in the following method. That is, by measuring with GPC (gel permeation chromatography), the obtained value was converted by standard polystyrene. The measuring condition is as follows; GPC apparatus: HLC-8120GPC column of Toso, flow rate: 0.8 ml/min, concentration: 1.0 g/L, injection volume: 100 microliters, column temperature: 40° C., and eluant: THF. In the case of Mw less than 500,000, (GMHHR-H), (GMHHR-H), and (G2000HHR) were coupled, or in the case of Mw of 500,000 or more, (G7000HXL), (GMHXL) and (GMHXL) were coupled.

On the pressure-sensitive adhesive sheet, third harmonic (355 nm) of YAG laser of average output of 5 W and repetition frequency of 30 kHz was focused by fθ lens into a diameter of 25 μm, and laser beam was scanned at a speed of 10 mm/sec by galvano scanner, but the pressure-sensitive adhesive sheet was not cut.

In succession, one side of polyimide film (thickness 25 μm) and pressure-sensitive adhesive sheet were adhered by roll laminator with the pressure-sensitive adhesive layer set at adhesion side. It was put on an X-Y stage mounting a stainless steel suction plate in the processing apparatus, with the work at the upper side. Further, third harmonic (355 nm) of YAG laser of average output of 5 W and repetition frequency of 30 kHz was focused by fθ lens into a diameter of 25 μm on the polyimide surface, and it was cut by scanning laser beam at a speed of 20 mm/sec by galvano scanner. At this time, the pressure-sensitive adhesive sheet was not cut, and only the work was cut off. Peeling the pressure-sensitive adhesive sheet from the polyimide, the periphery of the cut section of the pressure-sensitive adhesive sheet adhering surface (laser exit side) was observed, but no deposit was found. Since the pressure-sensitive adhesive sheet was not cut off, contamination from the suction stage was not recognized.

Comparative Example 7-1

In comparison 7-1, the work was processed same as in example 7-1 except that laser processing was done without adhering pressure-sensitive adhesive sheet. The periphery of the cut section at the laser exit side of polyimide (work) was observed, and lots of deposits of decomposition residue of polyimide and decomposition residue of glass epoxy resin suction plate were observed.

Later it was attempted to remove the residue by desmearing process using aqueous solution of potassium permanganate. However, the decomposition residue could not be removed completely. Besides, nickel was detected near the cut section, and residue from stainless steel was recognized.

Comparative Example 7-2

In comparison 7-2, the work was processed by laser same as in example 7-1 except that a soft vinyl chloride film (thickness 70 μm) with transmissivity of 35% was used as base material. Light transmissivity of pressure-sensitive adhesive sheet was 34.4% (355 nm). After laser processing, the work and pressure-sensitive adhesive sheet were observed, and both polyimide film and pressure-sensitive adhesive sheet were cut off.

Example 7-2

On a polyethylene film (base material) of 100 μm in thickness, a solution of acrylic pressure-sensitive adhesive which can be cured by ultraviolet ray was applied and dried to form a pressure-sensitive adhesive layer of 30 μm in thickness, and a pressure-sensitive adhesive sheet was obtained. In this base material, light transmissivity at 355 nm was measured, and 85.5% was obtained. Light transmissivity at 355 nm of pressure-sensitive adhesive sheet was 69.7%.

The solution of acrylic pressure-sensitive adhesive was prepared as follows. A mixed composition of 50 parts by weight of ethyl acrylate, 50 parts by weight of butyl acrylate, and 16 parts by weight of 2-hydroxy acrylate was copolymerized in a toluene solution, and an acrylic polymer (number-average molecular weight about 500,000) was obtained. In 100 parts by weight of this acrylic polymer, 20 parts by weight of 2-methacryloyl oxyethyl isocyanate was added for reaction, and a carbon-carbon double bond was introduced into the side chain inside the molecule of acrylic polymer (side chain length is 13 atoms). In 100 parts by weight of this polymer, 1 part of polyisocyanate crosslinking agent (Coronate L) and 3 parts by weight of alpha-hydroxy ketone (Irgacure 184) were blended. The blended mixture was uniformly dissolved in toluene as organic solvent, and a solution of acrylic pressure-sensitive adhesive was prepared.

On the other hand, a polyimide film (thickness 25 μm) was prepared, and on this polyimide film, a copper layer of 18 μm in thickness was formed, and a two-layer substrate was fabricated. This substrate was processed by exposing, developing and etching, and a specified circuit was formed. Further on a polyimide film (thickness 13 μm), an epoxy resin layer (thickness 15 μm) was formed, and a cover ray film was obtained. Gluing the cover ray film and the substrate, a flexible printed board was fabricated as the work.

In succession, the flexible printed board and pressure-sensitive adhesive sheet were adhered by roll laminator with the pressure-sensitive adhesive layer set at adhesion side. It was put on an X-Y stage mounting a glass epoxy resin suction plate in the processing apparatus, with the work at the upper side. Further, third harmonic (355 nm) of YAG laser of average output of 5 W and repetition frequency of 30 kHz was focused by fθ lens into a diameter of 25 μm on the flexible printed board surface, and it was cut by scanning laser beam at a speed of 20 mm/sec by galvano scanner. At this time, the pressure-sensitive adhesive sheet was not cut, and only the flexible printed board was cut off. Peeling the pressure-sensitive adhesive sheet from the flexible printed board, the periphery of the processed hole of the pressure-sensitive adhesive sheet adhering surface (laser exit side) was observed, but no deposit was found. Since the pressure-sensitive adhesive sheet was not cut off, contamination from the suction stage was not recognized.

Comparative Example 7-3

On a polyethylene film (base material) of 80 μm in thickness, a solution of acrylic pressure-sensitive adhesive which can be cured by ultraviolet ray was applied and dried to form a pressure-sensitive adhesive layer of 10 μm in thickness, and a pressure-sensitive adhesive sheet was obtained. In this base material, light transmissivity at 355 nm was measured, and 83.6% was obtained. Light transmissivity at 355 nm of pressure-sensitive adhesive sheet was 49.6%.

The solution of acrylic pressure-sensitive adhesive was prepared as follows. In 100 parts by weight of acrylic polymer (number-average molecular weight about 800,000) by copolymerization of methyl acrylate, 2-ethylhexyl, and acrylic acid at a ratio by weight of 70/30/10, 100 parts by weight of dipentaerythritol monohydroxy pentacrylate as photopolymerizable compound, and 5 parts by weight of alpha-amino ketone (Irgacure 369) as photopolymerization initiator were mixed. The mixture was uniformly dissolved in ethyl acetate as organic solvent, and a solution of acrylic pressure-sensitive adhesive was prepared.

In succession, the flexible printed board prepared same as in example 7-2 and pressure-sensitive adhesive sheet were adhered by roll laminator with the pressure-sensitive adhesive layer set at adhesion side. Further, the flexible printed board was cut off same as in example 7-2, and not only the flexible printed board but also the tack sheet were cut off. Besides, aluminum as detected near the cut section, and residue due to the suction stage was detected.

Example 7-3

On a polyethylene film (base material) of 80 μm in thickness, a solution of acrylic pressure-sensitive adhesive which can be cured by ultraviolet ray was applied and dried to form a pressure-sensitive adhesive layer of 5 μm in thickness, and a pressure-sensitive adhesive sheet was obtained. In this base material, light transmissivity at 355 nm was measured, and 85.5% was obtained. Light transmissivity at 355 nm of pressure-sensitive adhesive sheet was 84.7%.

The solution of acrylic pressure-sensitive adhesive was prepared as follows. In 100 parts by weight of acrylic polymer (number-average molecular weight about 1,000,000) by copolymerization of 2-ethylhexyl acrylate, N-acryloyl morpholine, and acrylic acid at a ratio by weight of 70/30/3, 2 parts by weight of epoxy crosslinking agent (Tetrad G of Mitsubishi Gas Chemical) and 2 parts by weight of isocyanate crosslinking agent (Coronate L of Nihon Polyurethane) were mixed. The mixture was uniformly dissolved in toluene as organic solvent, and a solution of acrylic pressure-sensitive adhesive was prepared.

On the other hand, a copper foil (thickness 18 μm) was prepared as the work, and one side of this copper foil and pressure-sensitive adhesive were adhered by roll laminator with the pressure-sensitive adhesive layer set at adhesion side. It was put on an X-Y stage mounting a suction plate having zirconia sprayed on a stainless steel plate, with the work at the upper side. Further, third harmonic (355 nm) of YAG laser of average output of 5 W and repetition frequency of 30 kHz was focused by fθ lens into a diameter of 25 μm on the copper foil surface, and it was cut by scanning laser beam at a speed of 10 mm/sec by galvano scanner. At this time, the pressure-sensitive adhesive sheet was not cut, and only the work was cut off. Peeling the pressure-sensitive adhesive sheet from the polyimide, the periphery of the processed hole of the pressure-sensitive adhesive sheet adhering surface (laser exit side) was observed, but no deposit was found. Since the pressure-sensitive adhesive sheet was not cut off, contamination from the suction stage was not recognized.

Example 7-4

A pressure-sensitive adhesive sheet prepared same as in example 7-1 was put on an X-Y stage mounting a glass epoxy resin suction plate, and third harmonic (355 nm) of YAG laser of average output of 5 W and repetition frequency of 30 kHz was focused by fθ lens into a diameter of 20 μm on the polyimide surface, and it was drilled by scanning laser beam at a speed of 20 mm/sec by galvano scanner. However, the pressure-sensitive adhesive sheet was not drilled.

On the other hand, a polyimide film (thickness 25 μm) was prepared as the work, and a copper foil of 9 μm in thickness was adhered on both sides, and a double-side copper-clad substrate was prepared.

This double-side copper-clad substrate and pressure-sensitive adhesive were adhered by roll laminator with the pressure-sensitive adhesive layer set at adhesion side. It was put on an X-Y stage mounting a glass epoxy resin suction plate in the processing apparatus, with the work at the upper side. Further, third harmonic (355 nm) of YAG laser of average output of 5 W and repetition frequency of 30 kHz was focused by fθ lens into a diameter of 20 μm on the polyimide surface, and a through-hole of 100 μm in diameter was formed by scanning laser beam by galvano scanner. At this time, the pressure-sensitive adhesive sheet was not pierced, and only the work was processed. The piercing speed was 300 holes/second. Peeling the pressure-sensitive adhesive sheet from the double-side copper-clad substrate, the periphery of the processed hole of the pressure-sensitive adhesive sheet adhering surface (laser exit side) was observed, but no deposit was found.

Comparative Example 7-4

In comparison 7-4, the work was processed same as in example 7-4 except that laser processing was done without adhering pressure-sensitive adhesive sheet. The periphery of the cut section at the laser exit side of double-side copper-clad substrate (work) was observed, and lots of deposits of decomposition residue of double-side copper-clad substrate and decomposition residue of glass epoxy resin suction plate were observed.

Later it was attempted to remove the residue by desmearing process using aqueous solution of potassium permanganate. However, the decomposition residue could not be removed completely.

Comparative Example 7-5

The pressure-sensitive adhesive sheet obtained in comparison 7-2 was processed by laser in the same condition as in example 7-4, and an opening of 100 μm in diameter was formed in the pressure-sensitive adhesive sheet.

Further, by laser processing in the same condition as in example 7-4, through-holes were formed not only in the double-side copper-clad substrate but also in the pressure-sensitive adhesive sheet, and decomposition deposits due to glass epoxy resin substrate were detected in the through-holes.

Example 7-5

The pressure-sensitive adhesive sheet prepared same as in example 7-2 was adhered to the polyimide film (thickness 50 μm), with the pressure-sensitive adhesive layer set at adhesion side. It was put on an X-Y stage mounting a stainless steel suction plate in the processing apparatus, with the work at the upper side. Further, third harmonic (355 nm) of YAG laser of average output of 5 W and repetition frequency of 30 kHz was focused by fθ lens on the polyimide film surface, and it was processed. As a result, a through-hole of incident side diameter of 30 μm and exit side (pressure-sensitive adhesive sheet adhering side) diameter of 20 μm was formed. No opening was formed in the pressure-sensitive adhesive sheet. Peeling the pressure-sensitive adhesive sheet from the double-side copper-clad substrate, the periphery of the processed hole of the pressure-sensitive adhesive sheet adhering surface (laser exit side) was observed, but the edge of the exit side opening was sharp, and no deposit was found, and desmearing process in later step was not needed.

Comparative Example 7-6

In comparison 7-6, the work was processed same as in example 7-5 except that laser processing was done without adhering pressure-sensitive adhesive sheet. The periphery of the opening at the laser exit side of polyimide film (work) was observed, and the opening was bulged by the effect of heat, and the sample was not put in practical use.

Later it was attempted to remove the residue by desmearing process using aqueous solution of potassium permanganate. However, nickel was detected near the opening, and the decomposition residue due to stainless steel suction plate was detected.

Example 7-6

On a polyethylene film (base material) of 80 μm in thickness, a solution of acrylic pressure-sensitive adhesive which can be cured by ultraviolet ray was applied and dried to form a pressure-sensitive adhesive layer of 10 μm in thickness, and a pressure-sensitive adhesive sheet was obtained. In this base material, light transmissivity at 355 nm was measured, and 81.9% was obtained. Light transmissivity at 355 nm of pressure-sensitive adhesive sheet was 74.1%.

The solution of acrylic pressure-sensitive adhesive was prepared as follows. In 100 parts by weight of acrylic polymer (number-average molecular weight about 600,000) by copolymerization of 2-ethylhexyl acrylate, methyl acrylate, and acrylic acid at a ratio by weight of 50/50/2, 3.5 parts by weight of isocyanate crosslinking agent (Coronate L of Nihon Polyurethane), 0.05 parts by weight of reaction catalyst (OL-1 of Tokyo Fine Chemical), and 15 parts by weight of plasticizer (dibutoxyethyl adipate) were mixed. The mixture was uniformly dissolved in toluene as organic solvent, and a solution of acrylic pressure-sensitive adhesive was prepared.

On the other hand, a polycarbonate film (thickness 25 μm) was prepared as the work, and one side of this and pressure-sensitive adhesive sheet were adhered by roll laminator with the pressure-sensitive adhesive layer set at adhesion side. It was put on an X-Y stage mounting a suction plate in the processing apparatus, with the work at the upper side. Further, third harmonic (355 nm) of YAG laser of average output of 5 W and repetition frequency of 15 kHz was emitted through a mask by mask imaging method. As a result, an opening of 25 μm in diameter was formed in the polycarbonate film. At this time, the pressure-sensitive adhesive sheet was not cut, and only the work was cut off. Energy density of laser beam was about 600 mJ/cm$^2$ on the work. Peeling the pressure-sensitive adhesive sheet from the polycarbonate film, the periphery of the opening of the laser exit side was observed, but no deposit was found.

Example 8

The following examples correspond to pressure-sensitive adhesive sheets H.

[Measure of the Number-Average Molecular Weight]

The number-average molecular weight of the synthesized acrylic polymer was measured in the following method. That is, the synthesized acrylic polymer was dissolved in THF at 0.1 wt %, the number-average molecular weight was measured by polystyrene conversion, using GPC (gel permeation chromatography). The measuring condition is as follows; GPC apparatus: HLC-8120GPC of Toso, column: (GMHHR-H)+(GMHHR-H)+(G2000HHR) of Toso, flow rate: 0.8 ml/min, concentration: 0.1 wt %, injection volume: 100 microliters, column temperature: 40° C., and eluant: THF.

[Measure of the Ratio of Etching]

The third harmonics (wavelength of 355 nm) of the YAG laser (maximum output 5 W, repetition frequency of 30 kHz) which carried out beam shaping were condensed with fθ lens in the Top Hat form, and the basis material surface was irradiated on condition that 200 (pulse) pulses. The depth (μm) of the slot formed in basis material was measured with the optical microscope after irradiation. The ratio of etching is calculated by the following formula.

Ratio of etching=depth of the slot (μm)/impulses (pulse)

Moreover, the energy fluence of the YAG laser was 8 (J/cm2).

Example 8-1

On a polyethylene film (base material, ratio of etching; 0) of 100 μm in thickness, a solution (1) of acrylic pressure-sensitive adhesive which can be cured by ultraviolet ray was applied and dried to form a pressure-sensitive adhesive layer of 10 μm in thickness, and a pressure-sensitive adhesive sheet was obtained. In this pressure-sensitive adhesive sheet, light transmission at 355 nm was measured, and light transmission of 78.9% was obtained.

The solution (1) of acrylic pressure-sensitive adhesive was prepared as follows. In 100 parts by weight of acrylic polymer (number-average molecular weight about 800,000) by copolymerization of butyl acrylate, ethyl acrylate, 2-hydroxy acrylate, and acrylic acid at a ratio by weight of 60/40/4/1, 90 parts by weight of dipentaerythritol monohydroxy pentacrylate as photopolymerizable compound, and 5 parts by weight of benzyl dimethyl ketal (Irgacure 651) as photopolymerization initiator were mixed. The mixture was uniformly dissolved in 650 parts by weight of toluene as organic solvent, and a solution (1) of acrylic pressure-sensitive adhesive was prepared.

In succession, one side of polyimide (thickness 100 μm) and pressure-sensitive adhesive were adhered by roll laminator with the pressure-sensitive adhesive layer set at adhesion side. It was put on an X-Y stage mounting a glass epoxy resin suction plate in the processing apparatus, with the work at the upper side. Further, third harmonic (355 nm) of YAG laser of average output of 5 W and repetition frequency of 30 kHz was focused by fθ lens into a diameter of 25 μm on the polyimide surface, and it was cut by scanning laser beam at a speed of 20 mm/sec by galvano scanner. At this time, the pressure-sensitive adhesive sheet was not cut (depth of the slot 0 μm), and only the work was cut off. Peeling the pressure-sensitive adhesive sheet from the polystyrene, the periphery of the processed hole of the pressure-sensitive adhesive sheet adhering surface (laser exit side) was observed, but no deposit was found. Since the pressure-sensitive adhesive sheet was not cut off, contamination from the suction stage was not recognized.

Comparative Example 8-1

In comparison 1-1, the work was processed same as in example 8-1 except that laser processing was done without adhering pressure-sensitive adhesive sheet. The periphery of the cut section at the laser exit side of polyimide (work) was observed, and lots of deposits of decomposition residue of polyimide and decomposition residue of glass epoxy resin suction plate were observed. Besides, nickel was detected near the cut section, and residue from stainless steel was recognized. Later it was attempted to remove the residue by desmearing process using aqueous solution of potassium permanganate. However, the decomposition residue could not be removed completely.

Comparative Example 8-2

In comparison 8-2, the work was processed by laser same as in example 8-1 except that polyethylene terephthalate (or PET, thickness 50 μm, ratio of etching 0.76) was used as pressure-sensitive adhesive sheet. Light transmission of pressure-sensitive adhesive sheet was 44.9%.

After laser processing, the work and pressure-sensitive adhesive sheet were observed, and the polyimide was cut off, but the pressure-sensitive adhesive sheet was heavily damaged, and foams including decomposition residue of pressure-sensitive adhesive sheet were formed between the pressure-sensitive adhesive sheet and decomposition residue of glass epoxy resin suction plate. Peeling the pressure-sensitive adhesive sheet, the periphery of the cut section at the laser exit side was observed, and lots of deposits of decomposition residue of polyimide were observed.

Example 8-2

On a base material (thickness 100 μm, ratio of etching; 0.02) of three layers of polyethylene, polypropylene and polyethylene, a solution (2) of acrylic pressure-sensitive adhesive which can be cured by ultraviolet ray was applied and dried to form a pressure-sensitive adhesive layer of 20 μm in thickness, and a pressure-sensitive adhesive sheet was obtained. In this pressure-sensitive adhesive sheet, light transmission at 355 nm was measured, and light transmission of 2.9% was obtained.

The solution (2) of acrylic pressure-sensitive adhesive was prepared as follows. In 100 parts by weight of acrylic polymer (number-average molecular weight about 500,000) by copolymerization of butyl acrylate, ethyl acrylate, and 2-hydroxy acrylate at a ratio by weight of 50/50/16, 20 parts by weight of 2-methacryloyl oxyethyl isocyanate was added for reaction, and a carbon-carbon double bond was introduced into the side chain inside the molecule of acrylic polymer (side chain length is 13 atoms). In 100 parts by weight of this polymer, 1 part of isocyanate crosslinking agent (Coronate L) and 3 parts by weight of alpha-hydroxy ketone (Irgacure 184) were blended. The blended mixture was uniformly dissolved in toluene as organic solvent, and a solution (2) of acrylic pressure-sensitive adhesive was prepared.

On the other hand, a polyimide film (thickness 25 μm) was prepared, and on this polyimide film, a copper layer of 18 μm in thickness was formed, and a two-layer substrate was fabricated. This substrate was processed by exposing, developing and etching, and a specified circuit was formed. Further on a polyimide film (thickness 13 μm), an epoxy resin layer (thickness 15 μm) was formed, and a cover ray film was obtained. Gluing the cover ray film and the substrate, a flexible printed board was fabricated as the work.

In succession, the flexible printed board and pressure-sensitive adhesive sheet were adhered by roll laminator with the pressure-sensitive adhesive layer set at adhesion side. It was put on an X-Y stage mounting a glass epoxy resin suction plate in the processing apparatus, with the work at the upper side. Further, third harmonic (355 nm) of YAG laser of average output of 5 W and repetition frequency of 30 kHz was focused by fθ lens into a diameter of 25 μm on the flexible printed board surface, and it was cut by scanning laser beam at a speed of 20 mm/sec by galvano scanner. At this time, the pressure-sensitive adhesive sheet was not cut (depth of the slot 0 μm), and only the flexible printed board was cut off. Peeling the pressure-sensitive adhesive sheet from the flexible printed board, the periphery of the processed hole of the pressure-sensitive adhesive sheet adhering surface (laser exit side) was observed, but no deposit was found. Since the pressure-sensitive adhesive sheet was not cut off, contamination from the suction stage was not recognized.

Example 8-3

On a ethylene-vinyl acetate copolymer film (base material, ratio of etching; 0) of 80 μm in thickness, a solution (3) of acrylic pressure-sensitive adhesive which can be cured by ultraviolet ray was applied and dried to form a pressure-sensitive adhesive layer of 5 μm in thickness, and a pressure-sensitive adhesive sheet was obtained. In this pressure-sensitive adhesive sheet, light transmission at 355 nm was measured, and light transmission of 84.7% was obtained.

The solution (3) of acrylic pressure-sensitive adhesive was prepared as follows. In 300 parts by weight of toluene, 100 parts by weight of acrylic polymer (number-average molecular weight about 1000,000) by copolymerization of 2-ethylhexyl acrylate, N-acryloyl morpholine, and acrylic acid at a ratio by weight of 70/30/3, 2 parts by weight of epoxy crosslinking agent (Tetrad G of Mitsubishi Gas Chemical), and 2 parts by weight of isocyanate crosslinking agent (Coronate L of Nihon Polyurethane) were mixed. Consequently, a solution (3) of acrylic pressure-sensitive adhesive was obtained.

On the other hand, a copper foil (thickness 18 μm) was prepared as the work, and one side of this copper foil and pressure-sensitive adhesive sheet were adhered by roll laminator with the pressure-sensitive adhesive layer set at adhesion side. It was put on an X-Y stage mounting a glass epoxy resin suction plate in the processing apparatus, with the work at the upper side. Further, third harmonic (355 nm) of YAG laser of average output of 5 W and repetition frequency of 30 kHz was focused by fθ lens into a diameter of 25 μm on the copper foil surface, and it was cut by scanning laser beam at a speed of 10 mm/sec by galvano scanner. At this time, the pressure-sensitive adhesive sheet was not cut (depth of the slot 0 μm), and only the work was cut off. Peeling the pressure-sensitive adhesive sheet from the polyimide, the periphery of the processed hole of the pressure-sensitive adhesive sheet adhering surface (laser exit side) was observed, but no deposit was found. Since the pressure-sensitive adhesive sheet was not cut off, contamination from the suction stage was not recognized.

Example 8-4

A polyimide film (thickness 25 μm) was prepared as the work, and a copper foil of 9 μm in thickness was adhered on both sides, and a double-side copper-clad substrate was prepared.

This double-side copper-clad substrate and pressure-sensitive adhesive sheet were adhered by roll laminator with the pressure-sensitive adhesive layer set at adhesion side. It was put on an X-Y stage mounting a glass epoxy resin suction plate in the processing apparatus, with the work at the upper side. Further, third harmonic (355 nm) of YAG laser of average output of 5 W and repetition frequency of 30 kHz was focused by fθ lens into a diameter of 20 μm on the polyimide surface, and a through-hole of 100 μm in diameter was formed by scanning laser beam by galvano scanner. At this time, the pressure-sensitive adhesive sheet was not pierced (depth of the hole 0 μm), and only the work was processed. The piercing speed was 200 holes/second. Peeling the pressure-sensitive adhesive sheet from the double-side copper-clad substrate, the periphery of the processed hole of the pressure-sensitive adhesive sheet adhering surface (laser exit side) was observed, but no deposit was found.

Example 8-5

In example 8-5, the flexible printed board was processed by laser same as in example 8-2 except that a polybutadiene film (thickness 100 μm, ratio of etching 0.24) was used as base material of pressure-sensitive adhesive sheet. In this pressure-sensitive adhesive sheet, light transmission at 355 nm was measured, and light transmission of 24.3% was obtained.

After laser processing, the work and pressure-sensitive adhesive sheet were observed, and the pressure-sensitive adhesive sheet was not cut (depth of the slot 8 μm), and only the flexible printed board was cut off. Peeling the pressure-sensitive adhesive sheet, the periphery of the cut section of the pressure-sensitive adhesive sheet adhering surface (laser exit side) was observed, but no deposit was found.

Example 8-6

In example 8-6, the flexible printed board was processed by laser same as in example 8-2 except that a polymethylpentene film (thickness 100 μm, ratio of etching 0.14) was used as base material of pressure-sensitive adhesive sheet. In this pressure-sensitive adhesive sheet, light transmission at 355 nm was measured, and light transmission of 77.1% was obtained.

After laser processing, the work and pressure-sensitive adhesive sheet were observed, and the pressure-sensitive adhesive sheet was not cut (depth of the slot 3 μm), and only the flexible printed board was cut off. Peeling the pressure-sensitive adhesive sheet, the periphery of the cut section of the pressure-sensitive adhesive sheet adhering surface (laser exit side) was observed, but no deposit was found.

Example 8-7

In example 8-7, the flexible printed board was processed by laser same as in example 8-2 except that a polynorbornene film (thickness 100 μm, ratio of etching 0.14) was used as base material of pressure-sensitive adhesive sheet. In this pressure-sensitive adhesive sheet, light transmission at 355 nm was measured, and light transmission of 89.8% was obtained.

After laser processing, the work and pressure-sensitive adhesive sheet were observed, and the pressure-sensitive adhesive sheet was not cut (depth of the slot 4 μm), and only the flexible printed board was cut off. Peeling the pressure-sensitive adhesive sheet, the periphery of the cut section of the pressure-sensitive adhesive sheet adhering surface (laser exit side) was observed, but no deposit was found.

Example 8-8

In example 8-8, the flexible printed board was processed by laser same as in example 8-2 except that a polyvinylalchol film (thickness 100 μm, ratio of etching 0.001) was used as base material of pressure-sensitive adhesive sheet. In this pressure-sensitive adhesive sheet, light transmission at 355 nm was measured, and light transmission of 87.7% was obtained.

After laser processing, the work and pressure-sensitive adhesive sheet were observed, and the pressure-sensitive adhesive sheet was not cut (depth of the slot 0 μm), and only the flexible printed board was cut off. Peeling the pressure-sensitive adhesive sheet, the periphery of the cut section of the pressure-sensitive adhesive sheet adhering surface (laser exit side) was observed, but no deposit was found.

Example 8-9

In example 8-9, the flexible printed board was processed by laser same as in example 8-2 except that a polyurethane film (thickness 100 μm, ratio of etching 0.29) was used as base material of pressure-sensitive adhesive sheet. In this pressure-sensitive adhesive sheet, light transmission at 355 nm was measured, and light transmission of 6.7% was obtained.

After laser processing, the work and pressure-sensitive adhesive sheet were observed, and the pressure-sensitive adhesive sheet was not cut (depth of the slot 12 μm), and only the flexible printed board was cut off. Peeling the pressure-sensitive adhesive sheet, the periphery of the cut section of the pressure-sensitive adhesive sheet adhering surface (laser exit side) was observed, but no deposit was found.

Example 8-10

In example 8-10, the flexible printed board was processed by laser same as in example 8-2 except that a polyethyleneglychol film (thickness 100 μm, ratio of etching 0.05) was used as base material of pressure-sensitive adhesive sheet. In this pressure-sensitive adhesive sheet, light transmission at 355 nm was measured, and light transmission of 1.8% was obtained.

After laser processing, the work and pressure-sensitive adhesive sheet were observed, and the pressure-sensitive adhesive sheet was not cut (depth of the slot 0 μm), and only the flexible printed board was cut off. Peeling the pressure-sensitive adhesive sheet, the periphery of the cut section of the pressure-sensitive adhesive sheet adhering surface (laser exit side) was observed, but no deposit was found.

Contamination of the surface (laser beam exit side) by the decomposition thing can be effectively controlled by using the pressure-sensitive adhesive sheet for laser processing whose ratio of etching of basis material is 0.4 or less so that clearly from the example and the comparative Example.

INDUSTRIAL APPLICABILITY

As described herein, the invention can suppress generation of decomposition residue at the time of laser processing, in particular, decreasing occurrence of decomposition residue from the stage for fixing the work and suppressing contamination between the work and the pressure-sensitive adhesive sheet, or the reverse side of machining. Accordingly, wet desmearing or other later process can be omitted, and waste liquid treatment is not needed in later process, which contributes to reduction of environmental load. Besides, since decomposition deposits can be decreased, a higher power of laser beam is realized, and the through-put may be enhanced. As a result, laser processed parts can be manufactured easily and at high production efficiency. Meanwhile, since the pressure-sensitive adhesive sheet has a pressure-sensitive adhesive layer for adhering and fixing the work, if a specified region of the work is cut off at once, dropping of the work is prevented, and handling is improved.

The invention claimed is:

1. A method of manufacturing laser processed parts comprising:
providing a pressure-sensitive adhesive sheet for laser processing a work, wherein the pressure-sensitive adhesive sheet comprises:
a base material; and
at least a pressure-sensitive adhesive layer provided on the base material,
wherein the pressure-sensitive adhesive sheet has a ratio of etching (etching rate/energy fluence) of the base material which is 0.4 [($\mu$m/pulse)/(J/cm$^2$)] or less when the ratio of etching is measured as the depth ($\mu$m) of a slot formed per pulse of a YAG laser with an energy fluence of 8 J/cm$^2$,
attaching the pressure-sensitive adhesive sheet to a work on a laser beam exit side via the pressure-sensitive adhesive layer,
laser processing the work by irradiating the work with a laser beam of a wavelength in the ultraviolet region,
processing the work by ablation, and
peeling the pressure-sensitive adhesive sheet from the processed work.

2. The manufacturing method of laser processed parts according to claim 1, wherein said work is any one of sheet materials, circuit boards, semiconductor wafers, glass substrates, ceramic substrates, metal substrates, semiconductor laser or other light emitting or receiving element substrates, MEMS substrates, semiconductor packages, cloth, leather, or paper.

3. The manufacturing method of laser processed parts according to claim 1, wherein the step of processing the work is a step of cutting or piercing the work.

4. The manufacturing method of laser processed parts according to claim 1, wherein deposit of decomposition residue between the work and the pressure-sensitive adhesive sheet on the reverse-side of machining contamination is suppressed.

5. The manufacturing method of laser processed parts according to claim 1, wherein the manufacturing method does not utilize wet desmearing to remove decomposition residue.

6. The manufacturing method of laser processed parts according to claim 1, wherein the base material of the pressure-sensitive adhesive sheet is characterized as having an etching rate of 3.2 $\mu$m/pulse or less when exposed to a YAG laser with an energy fluence of 8 J/cm$^2$.

7. The manufacturing method of laser processed parts according to claim 1, wherein the work is processed without thermal cutting.

8. The manufacturing method of laser processed parts according to claim 1, wherein the adhesive sheet has a light transmissivity of 90% or more.

* * * * *